United States Patent
Chang et al.

(10) Patent No.: US 9,520,482 B1
(45) Date of Patent: Dec. 13, 2016

(54) METHOD OF CUTTING METAL GATE

(71) Applicant: Taiwan Semiconductor Manufacturing Company, Ltd., Hsin-Chu (TW)

(72) Inventors: Po-Chin Chang, Hsin-Chu (TW); Chih-Hao Wang, Hsinchu County (TW); Kai-Chieh Yang, Kaohsiung (TW); Shih-Ting Hung, Taipei County (TW); Wei-Hao Wu, Hsinchu (TW); Gloria Wu, Hsin-Chu (TW); Inez Fu, Hsinchu (TW); Chia-Wei Su, Hsin-Chu (TW); Yi-Hsuan Hsiao, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/940,841

(22) Filed: Nov. 13, 2015

(51) Int. Cl.
  *H01L 21/8238* (2006.01)
  *H01L 29/66* (2006.01)
  *H01L 27/092* (2006.01)

(52) U.S. Cl.
  CPC . *H01L 29/66545* (2013.01); *H01L 21/823814* (2013.01); *H01L 21/823821* (2013.01); *H01L 21/823842* (2013.01); *H01L 21/823864* (2013.01); *H01L 21/823878* (2013.01); *H01L 27/0924* (2013.01)

(58) Field of Classification Search
  CPC .................. H01L 21/66545; H01L 21/823821; H01L 21/823842; H01L 27/0924
  USPC .......................................................... 438/218
  See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0286765 A1* | 10/2015 | Wang .................. | G06F 17/5072 716/55 |

(Continued)

*Primary Examiner* — David S Blum
(74) *Attorney, Agent, or Firm* — Haynes and Boone, LLP

(57) ABSTRACT

A method for fabricating a semiconductor device includes forming a first fin and a second fin on a substrate. The first fin has a first gate region and the second fin has a second gate region. The method also includes forming a metal-gate line over the first and second gate regions. The metal-gate line extends from the first fin to the second fin. The method also includes applying a line-cut to separate the metal-gate line into a first sub-metal gate line and a second sub-metal gate line and forming an isolation region within the line cut.

20 Claims, 42 Drawing Sheets

(56) References Cited

U.S. PATENT DOCUMENTS

2016/0133632 A1\* 5/2016 Park .................. H01L 27/1104
257/369

\* cited by examiner

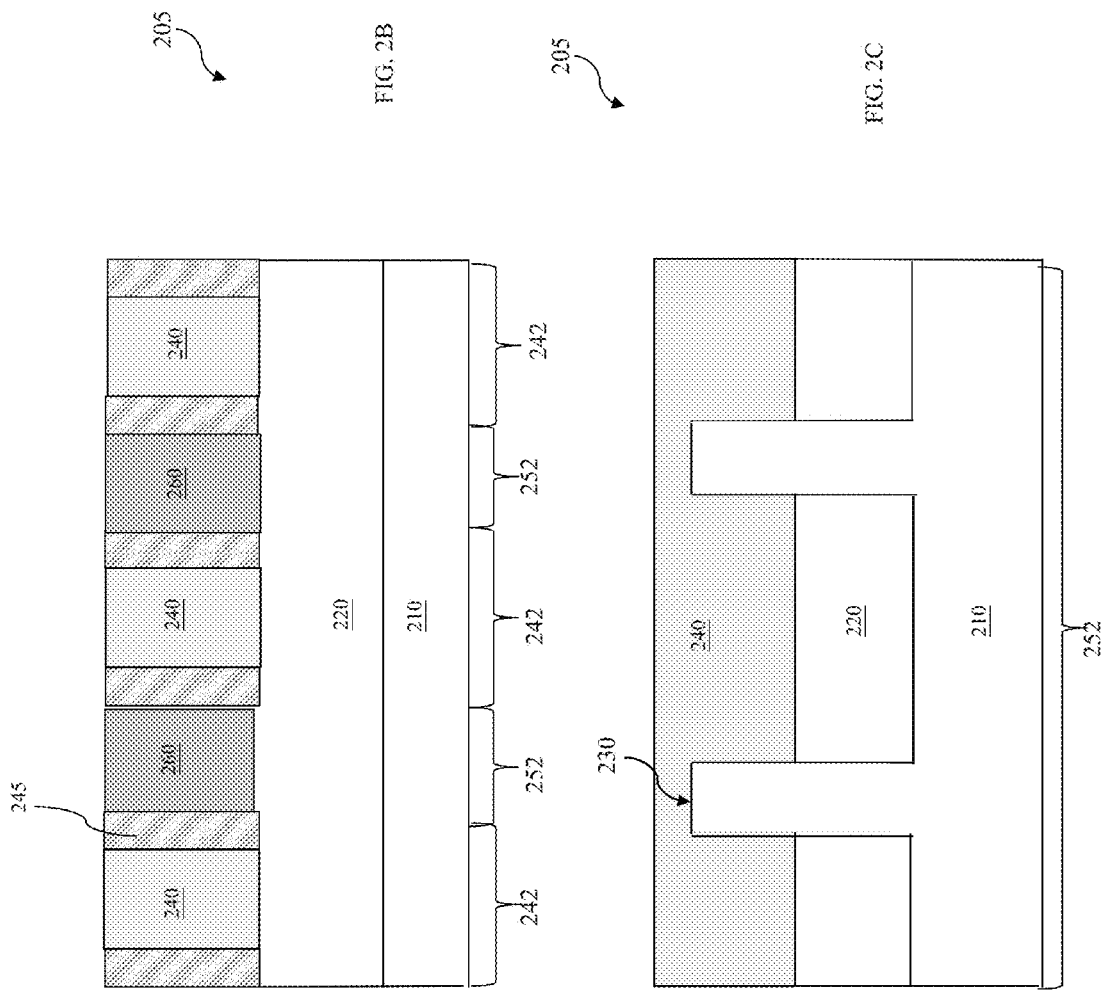

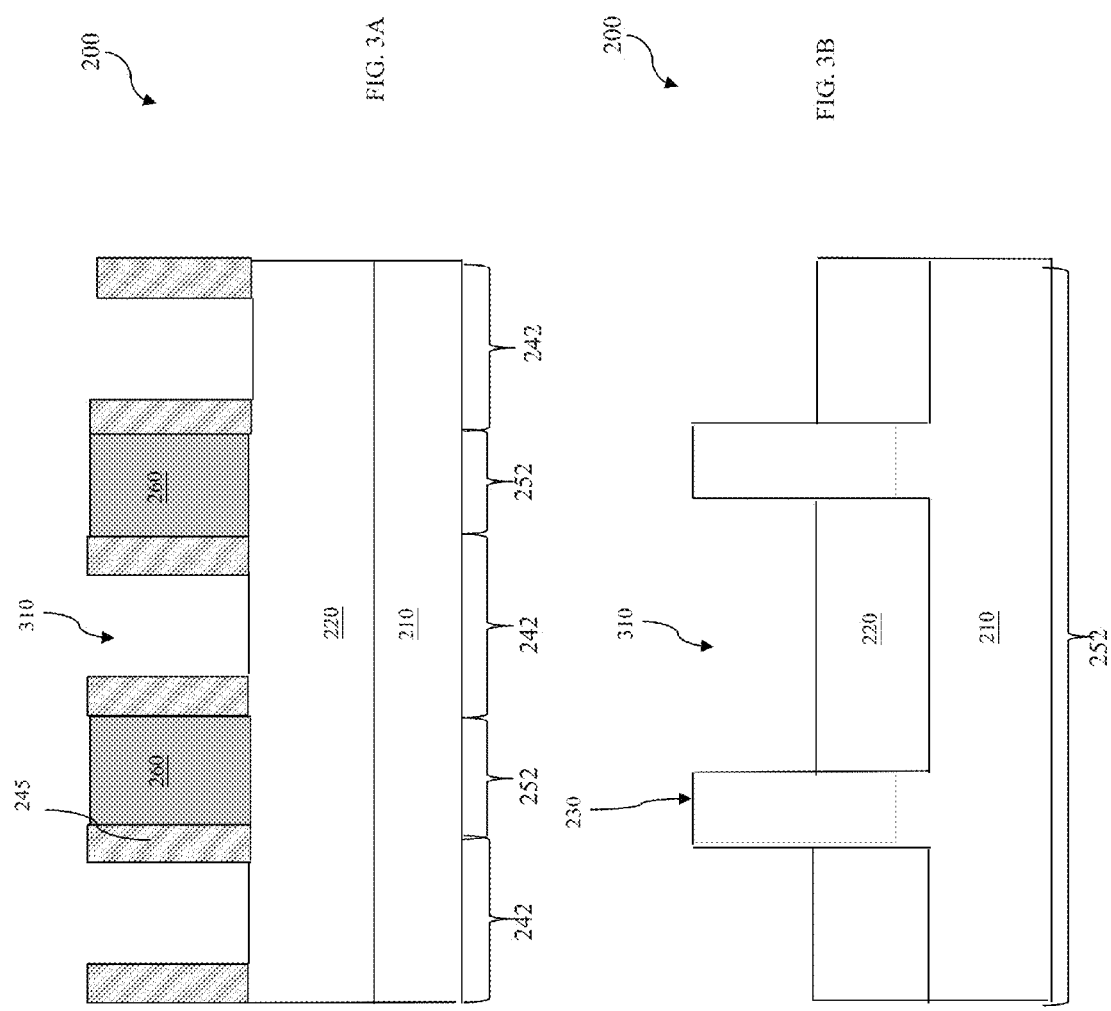

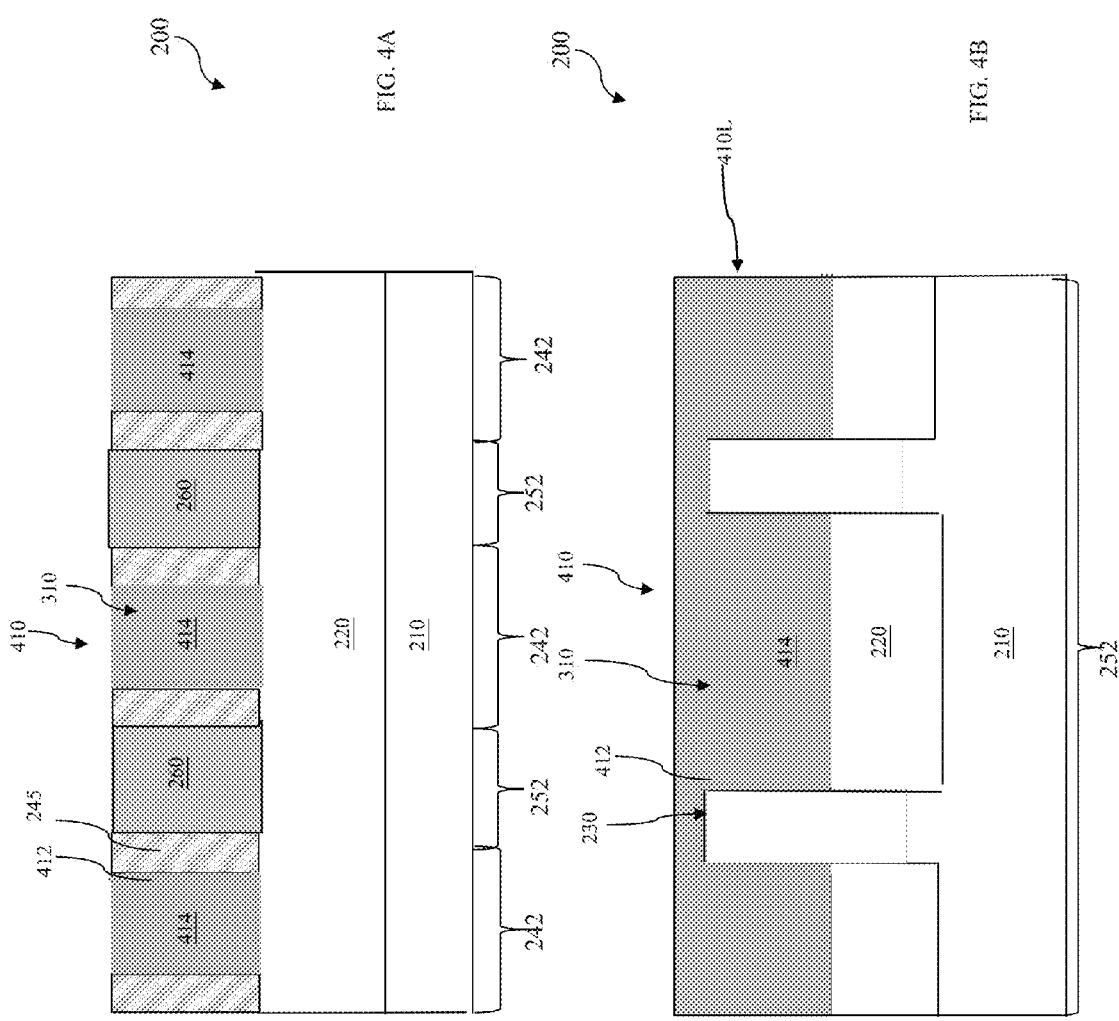

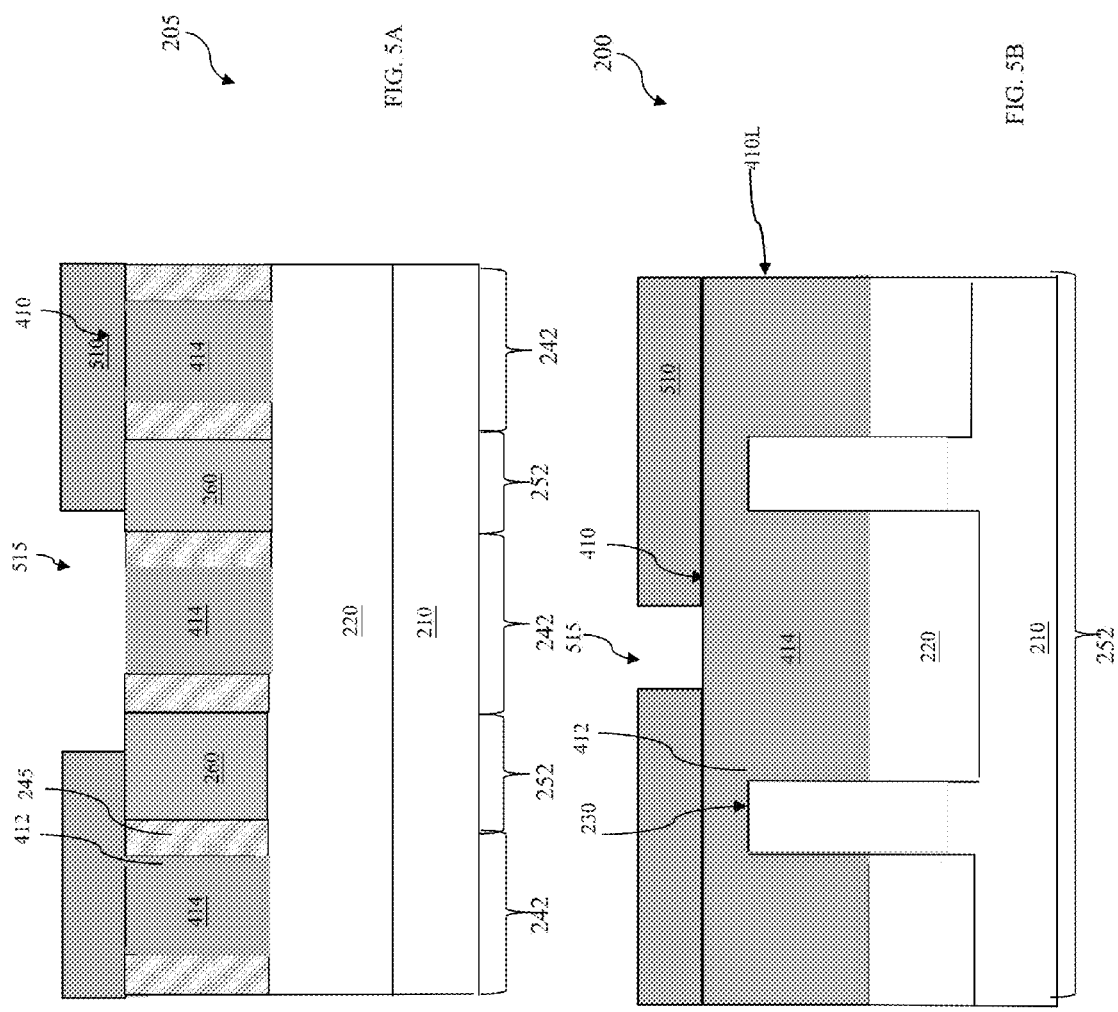

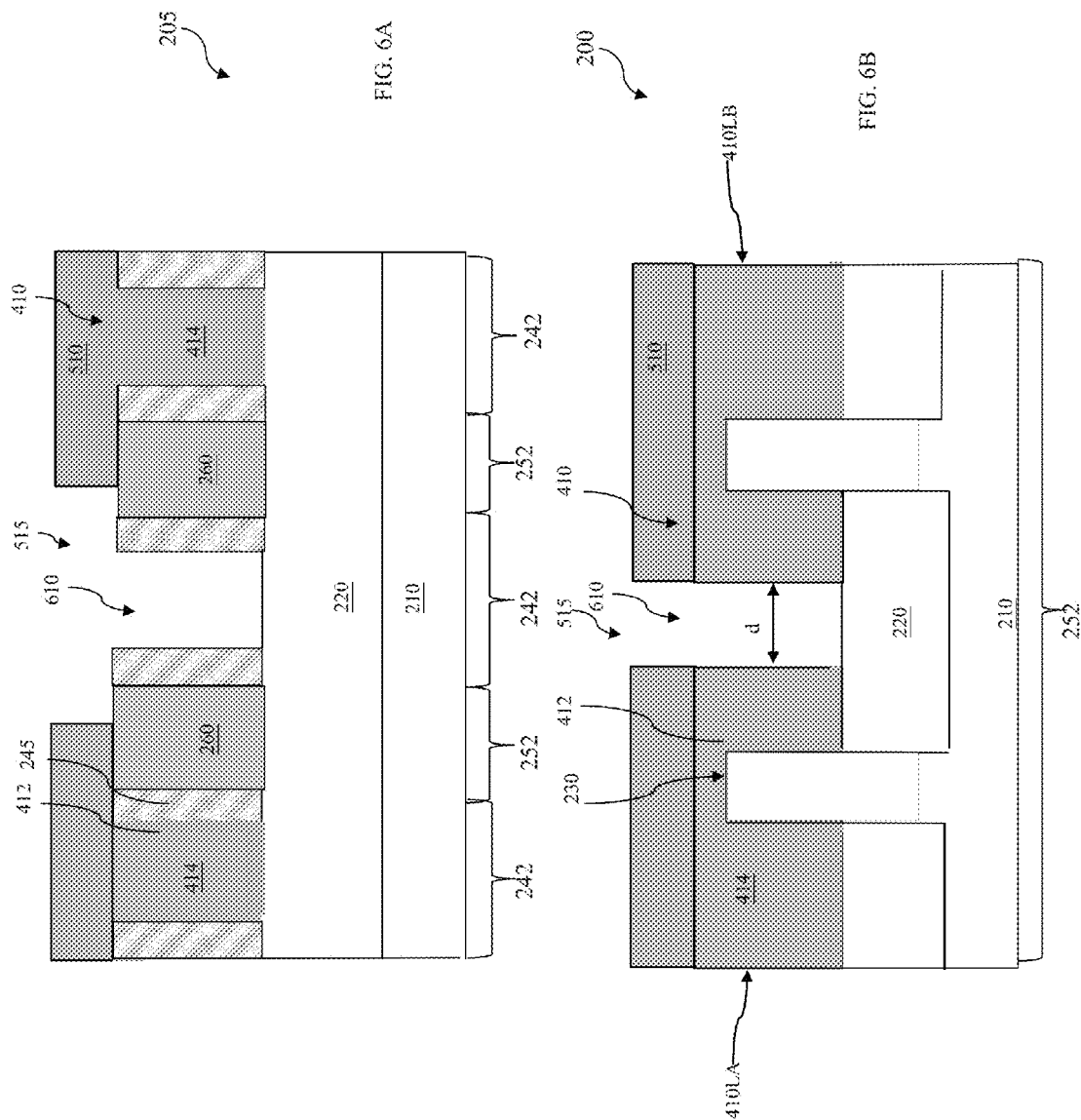

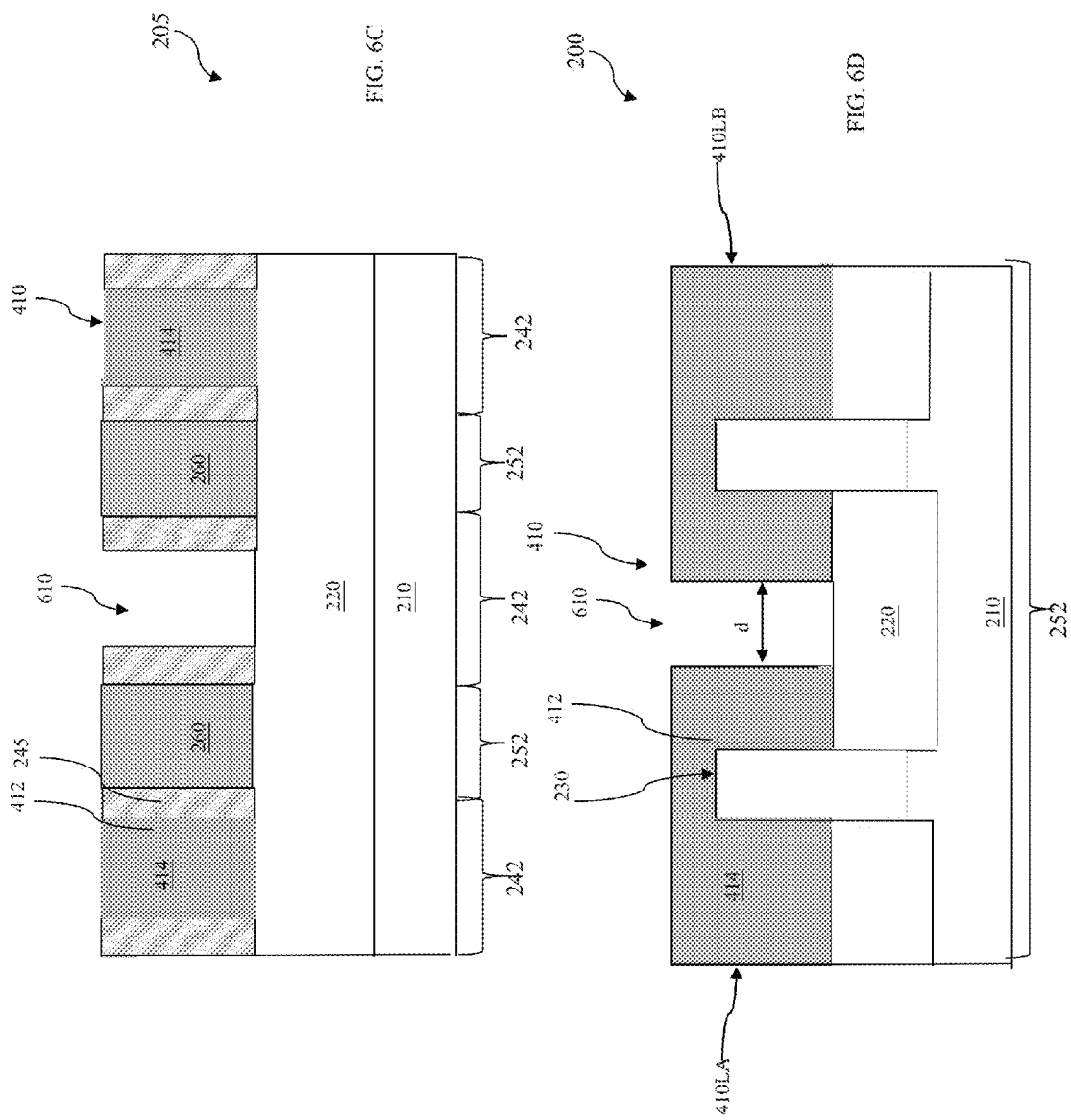

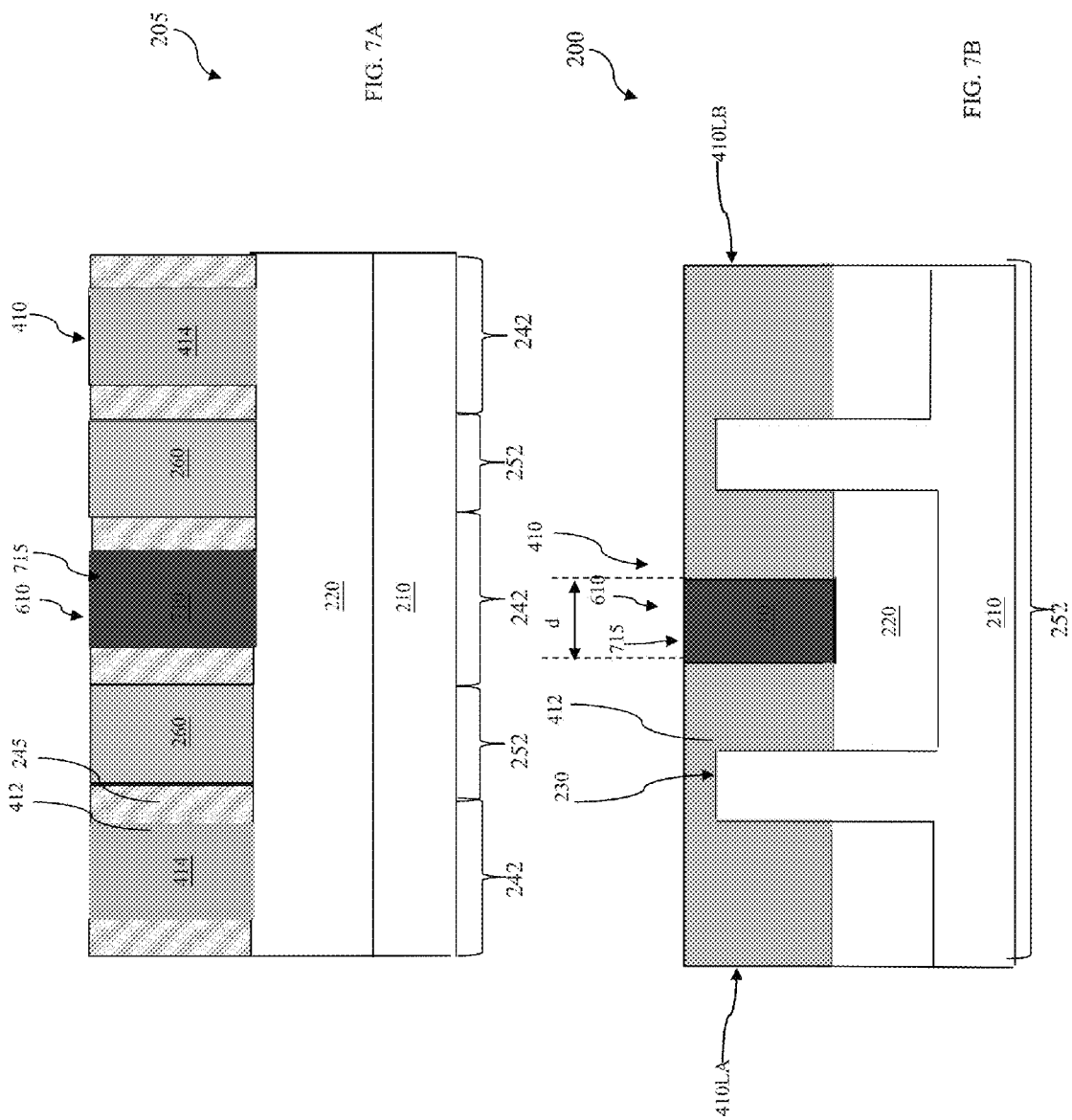

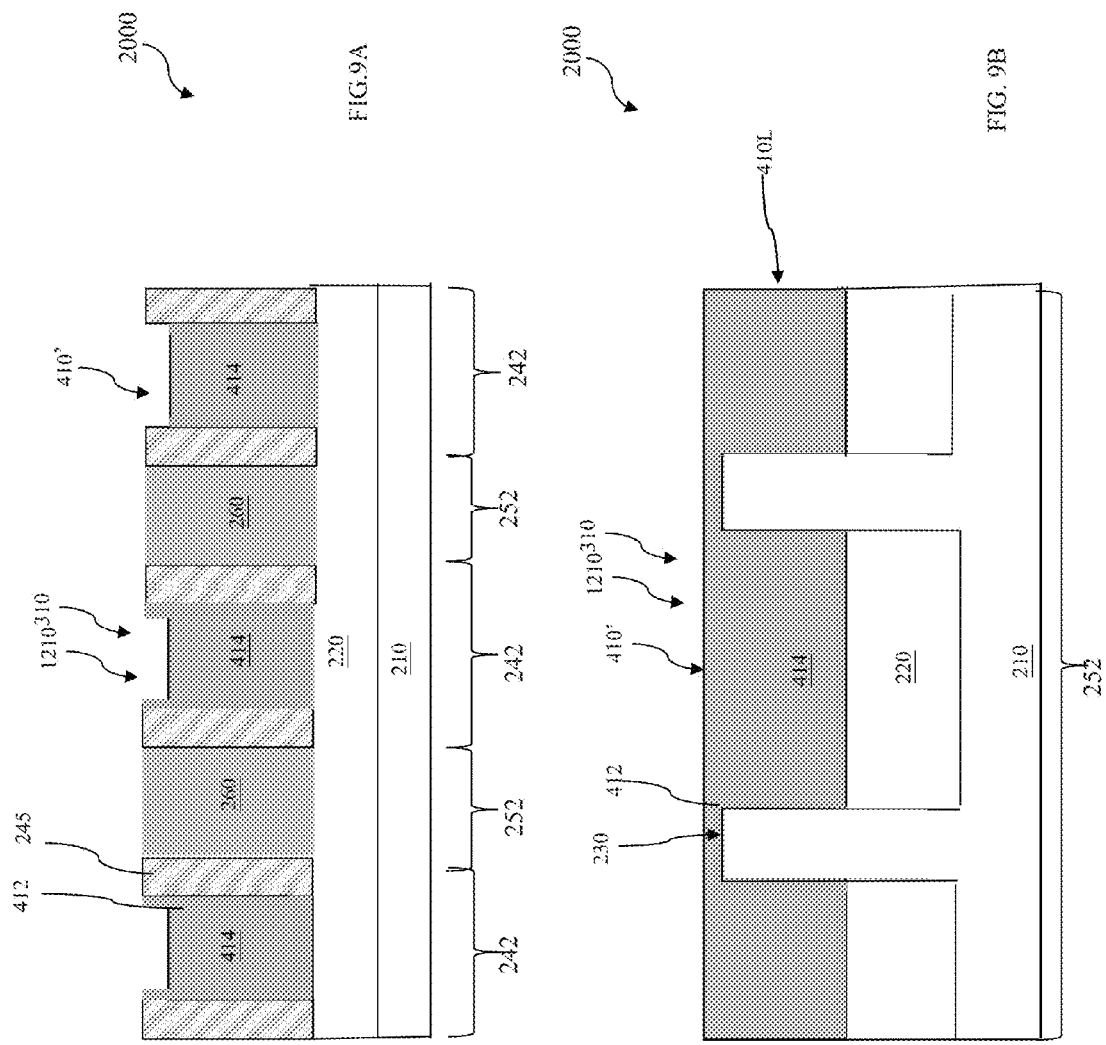

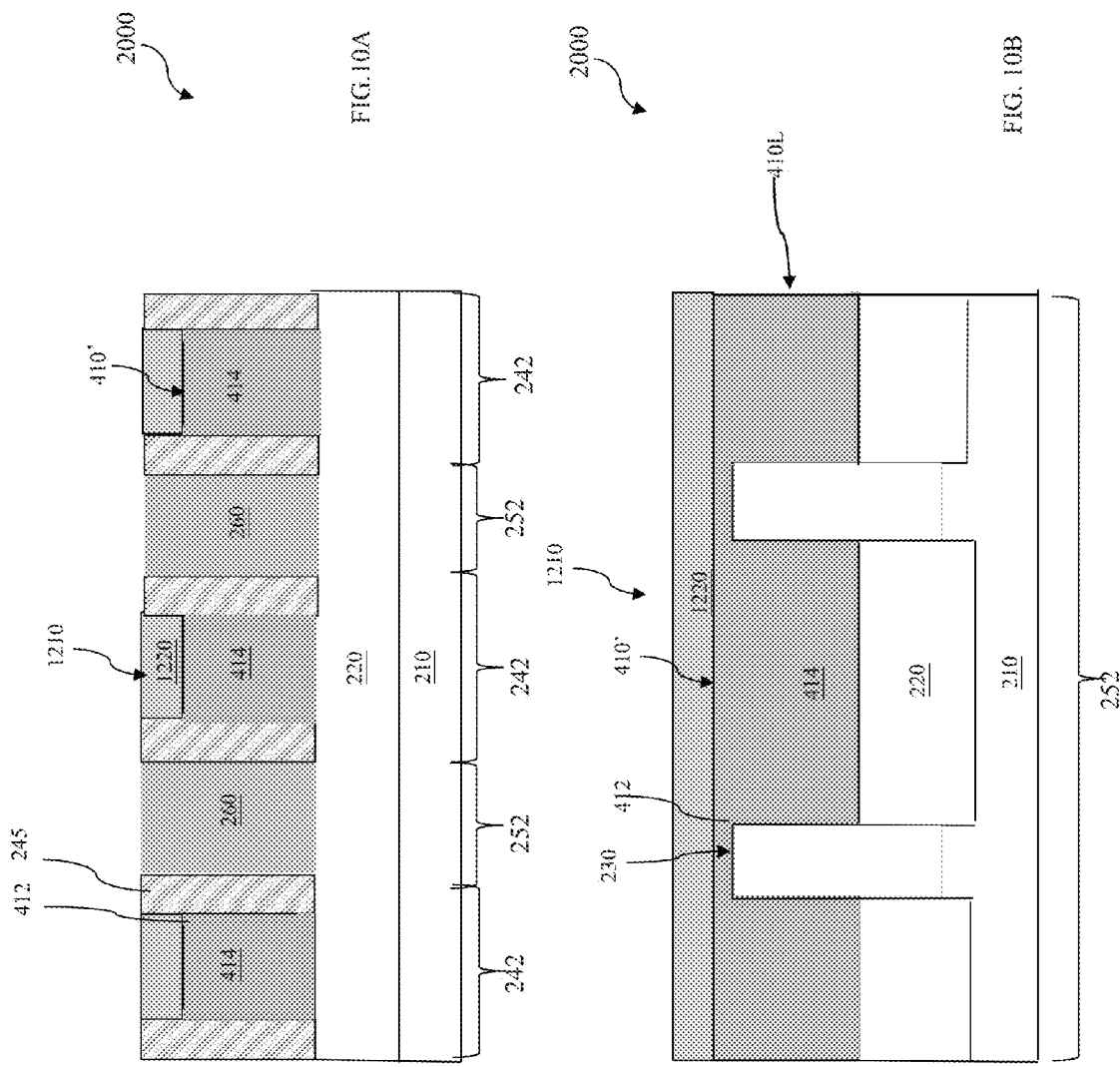

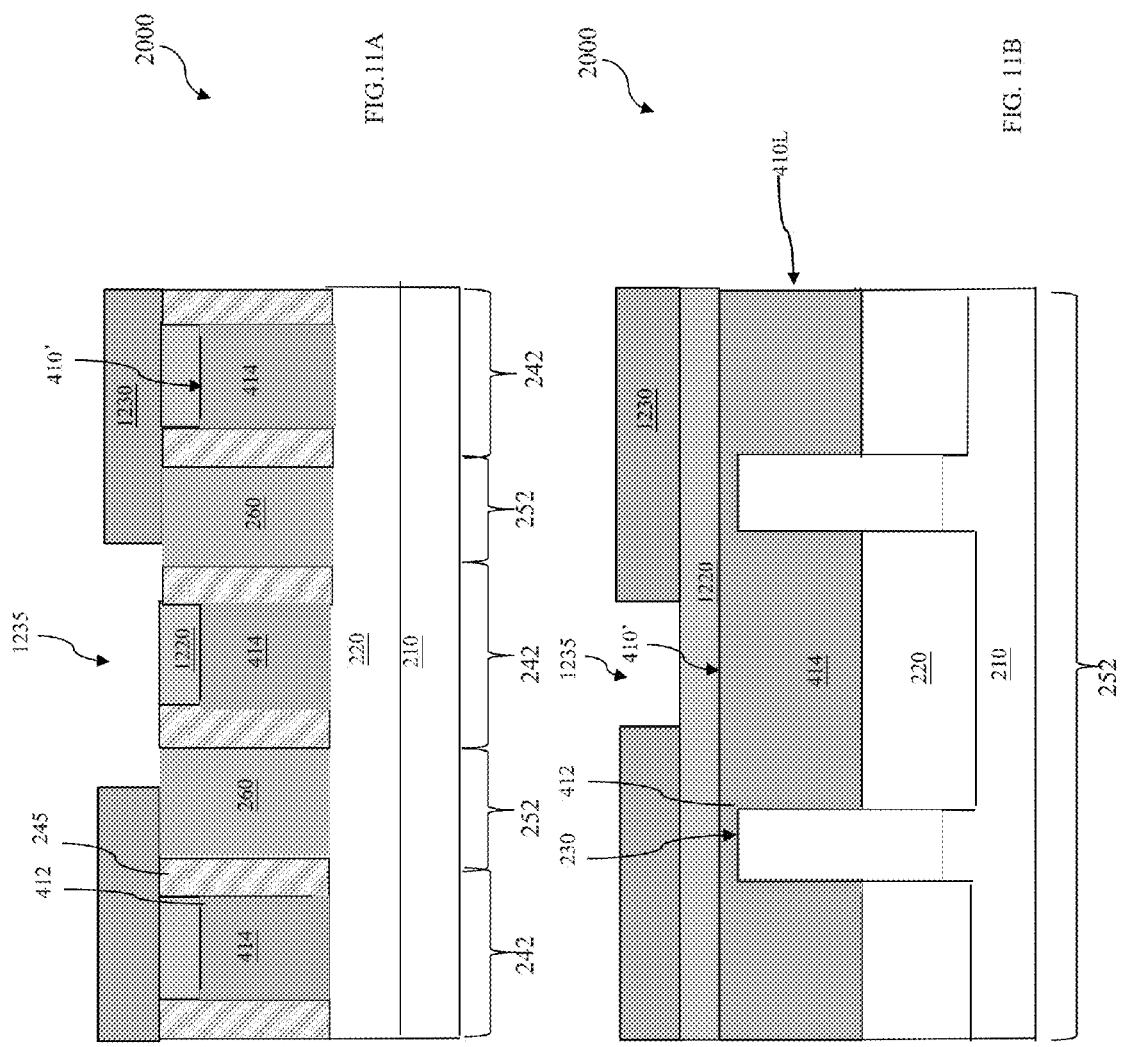

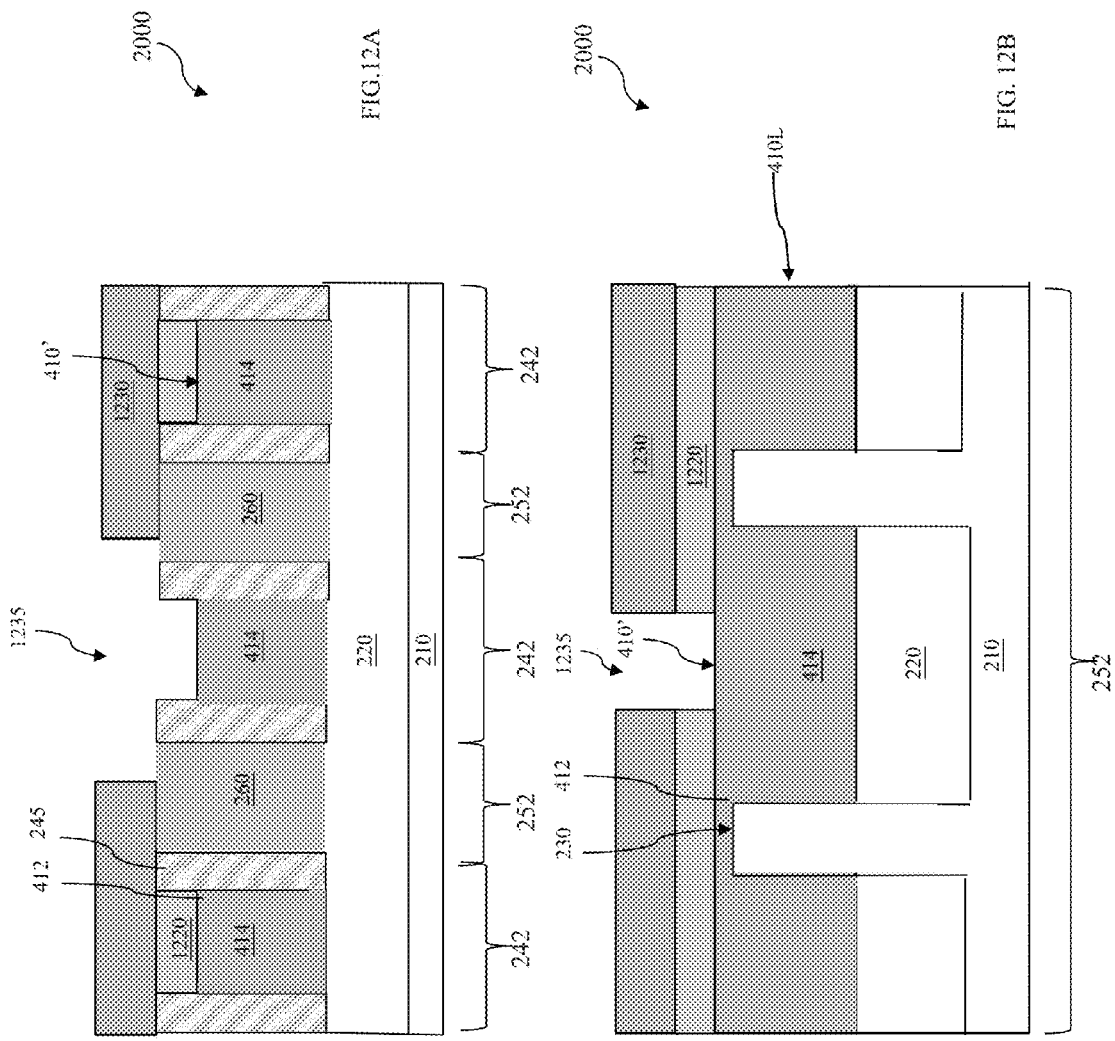

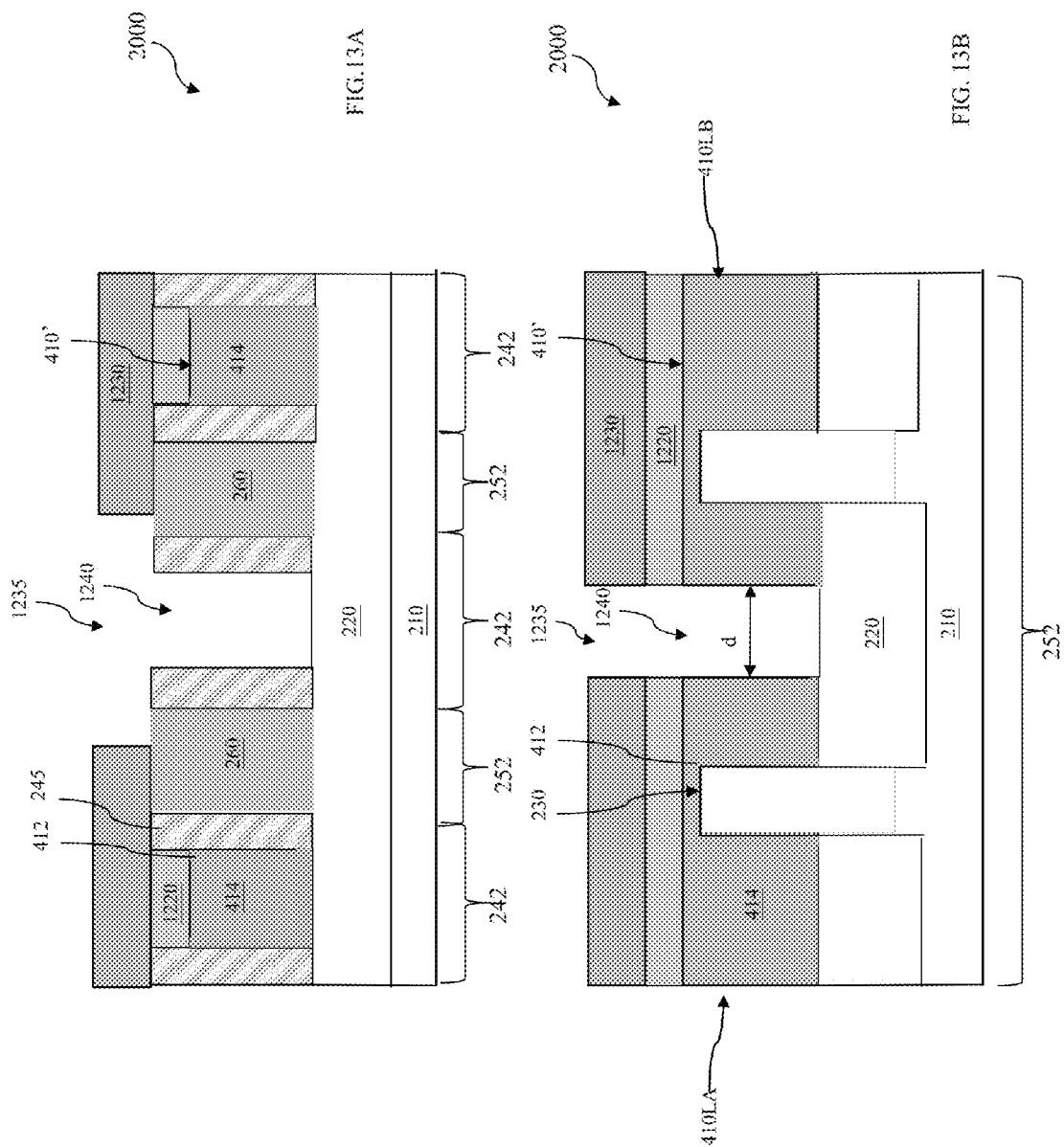

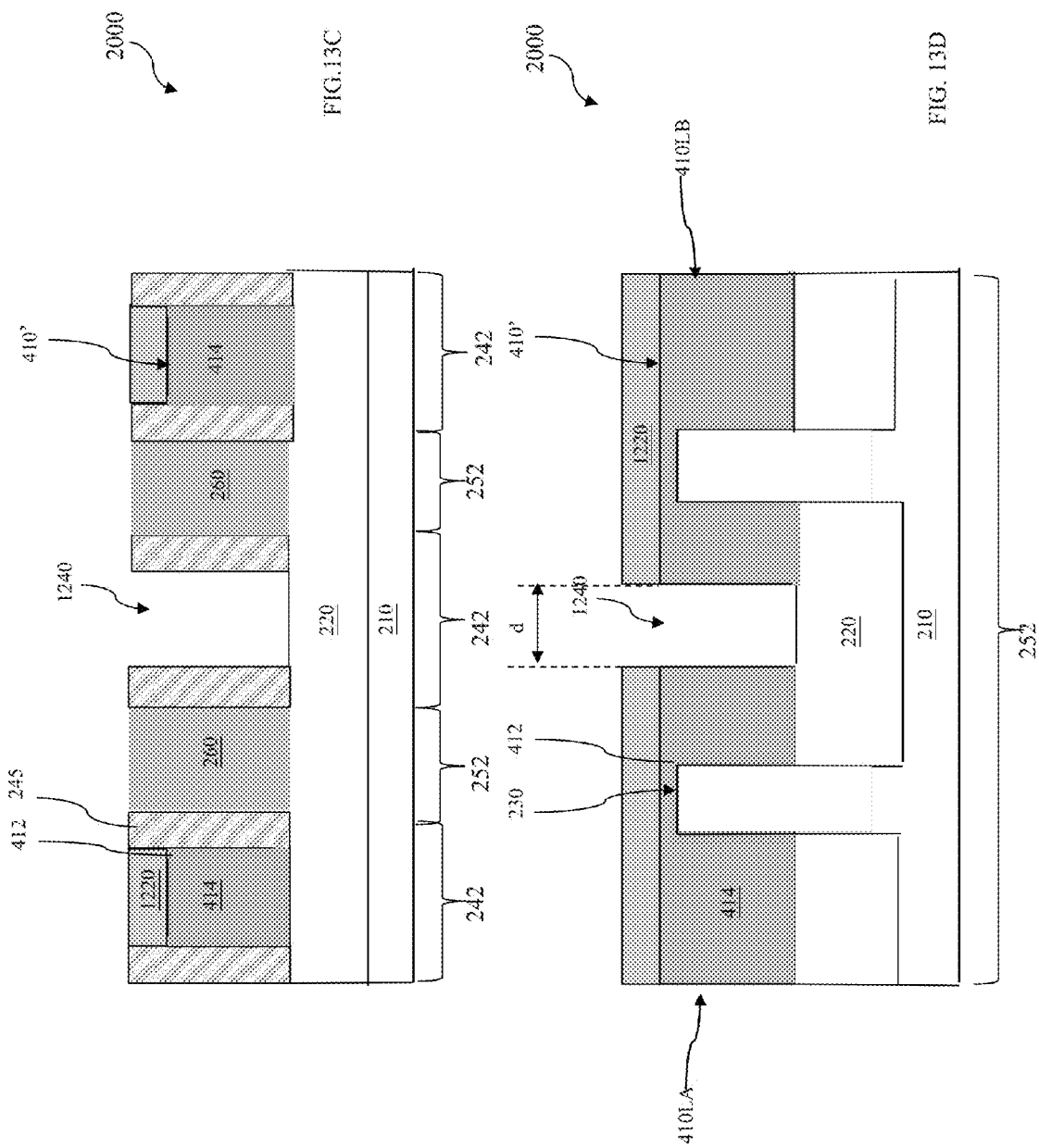

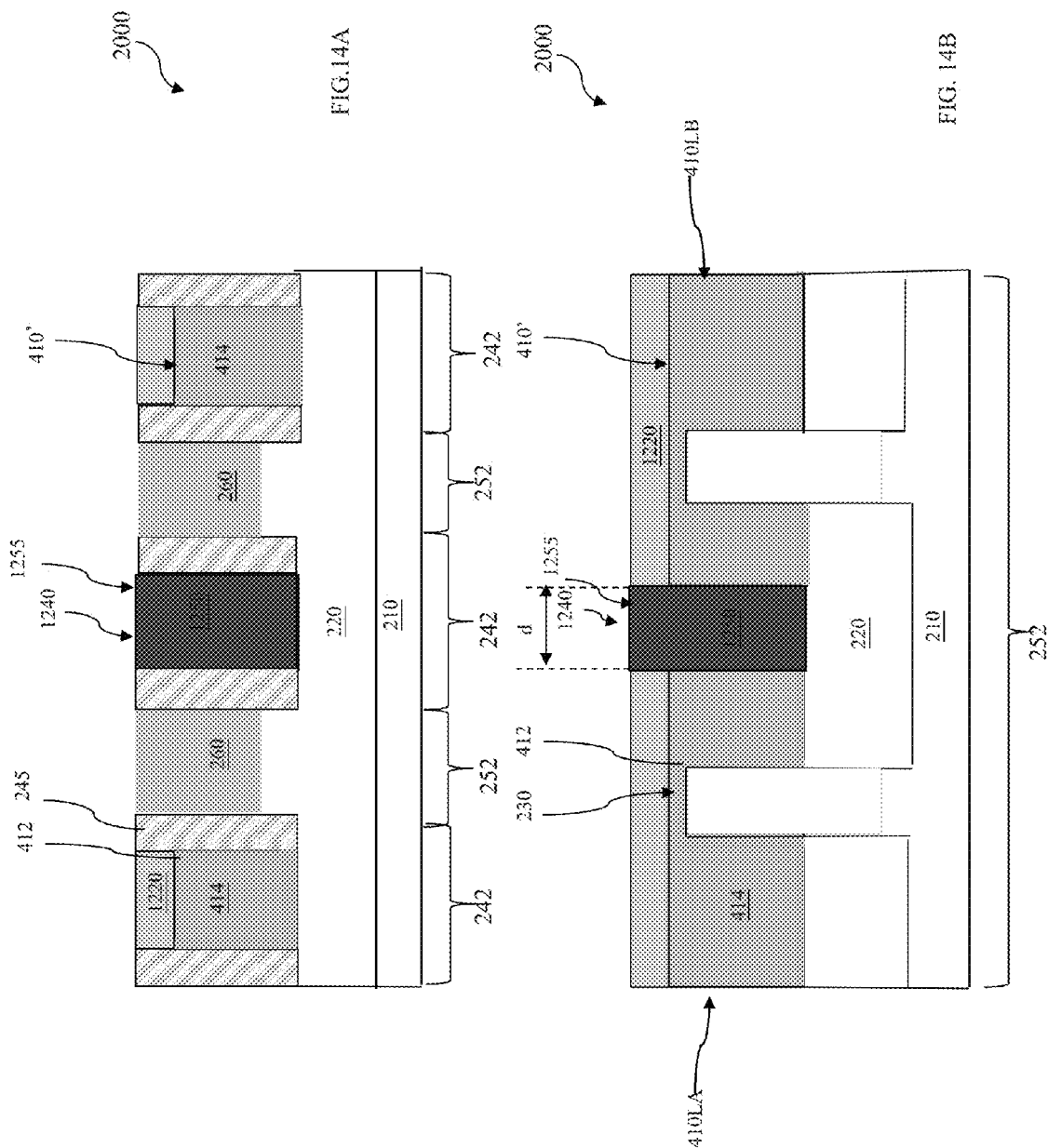

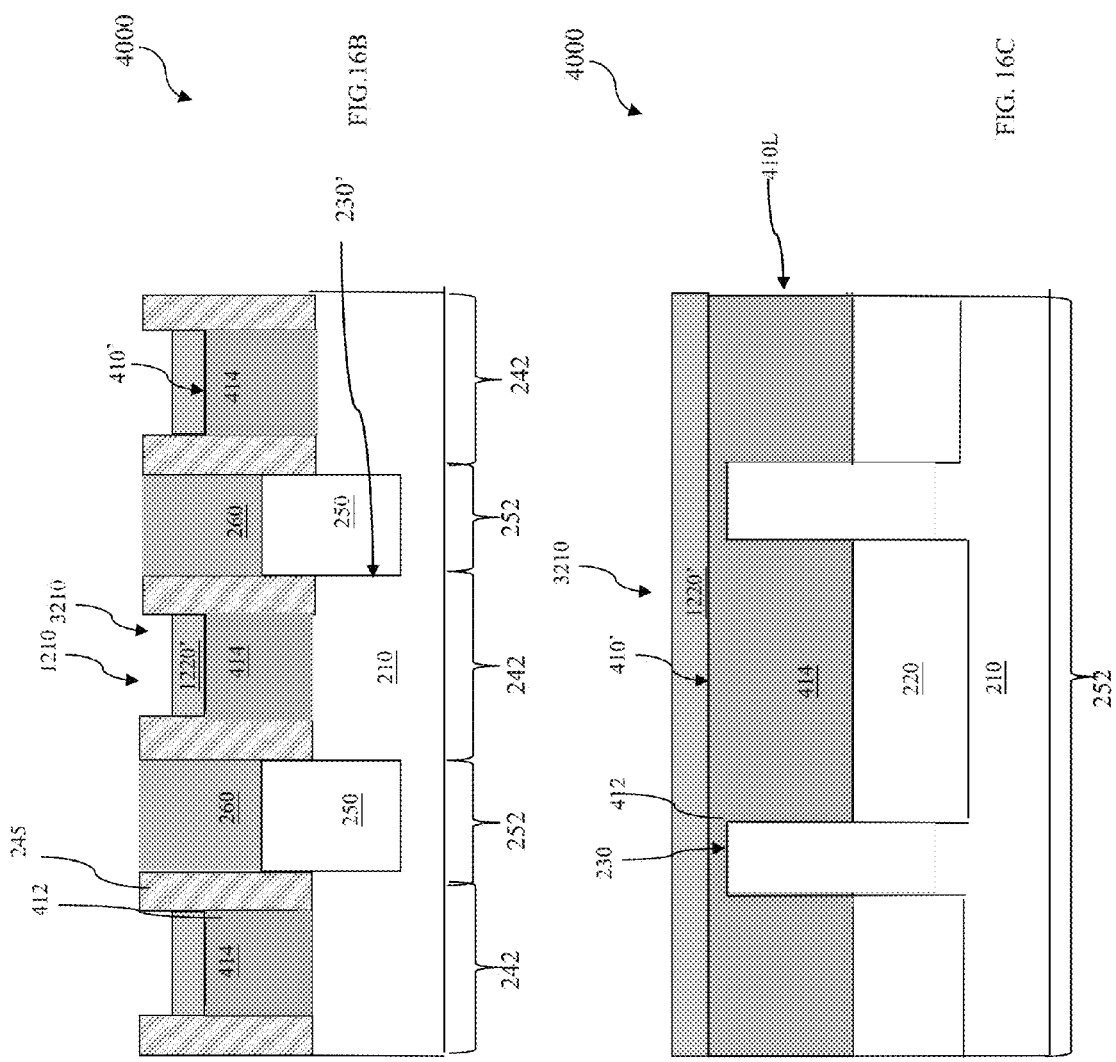

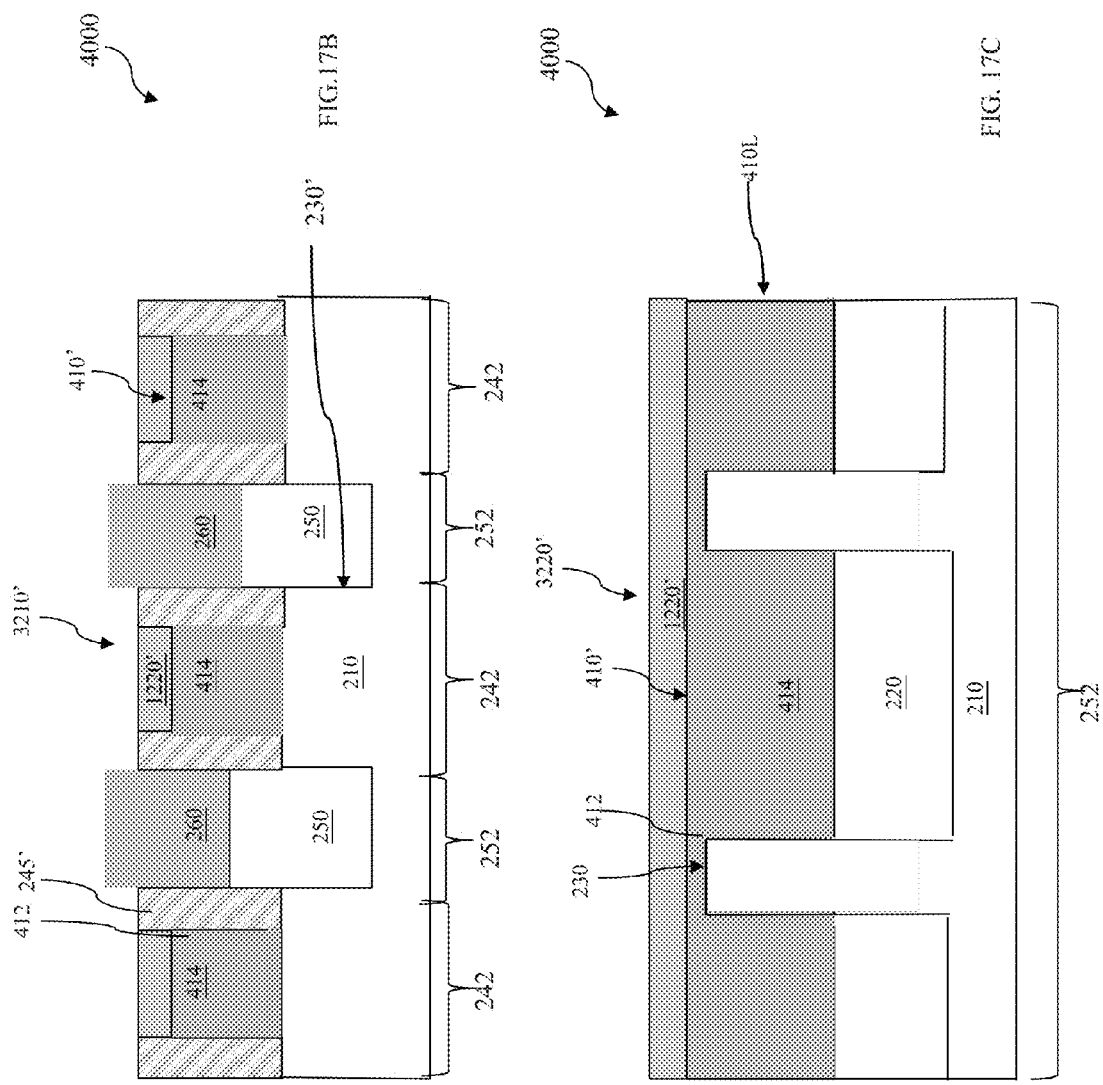

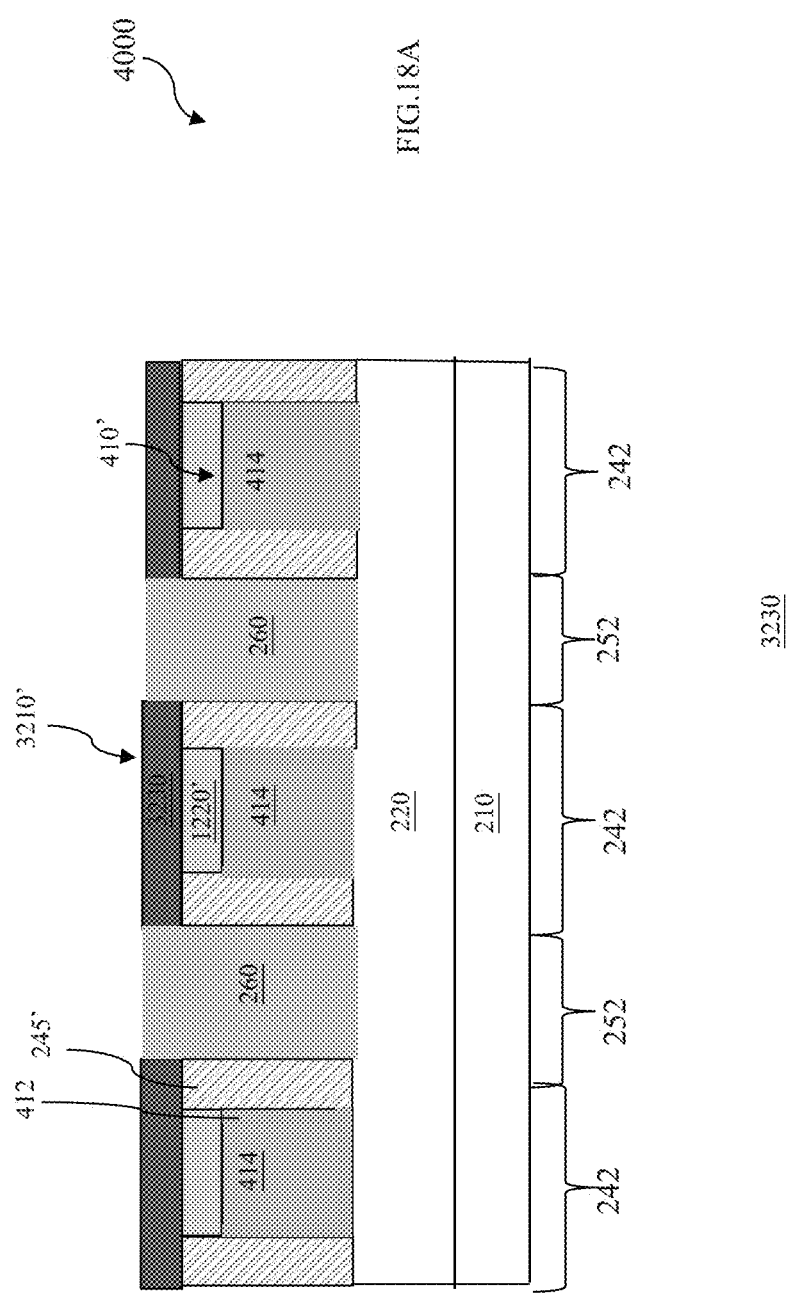

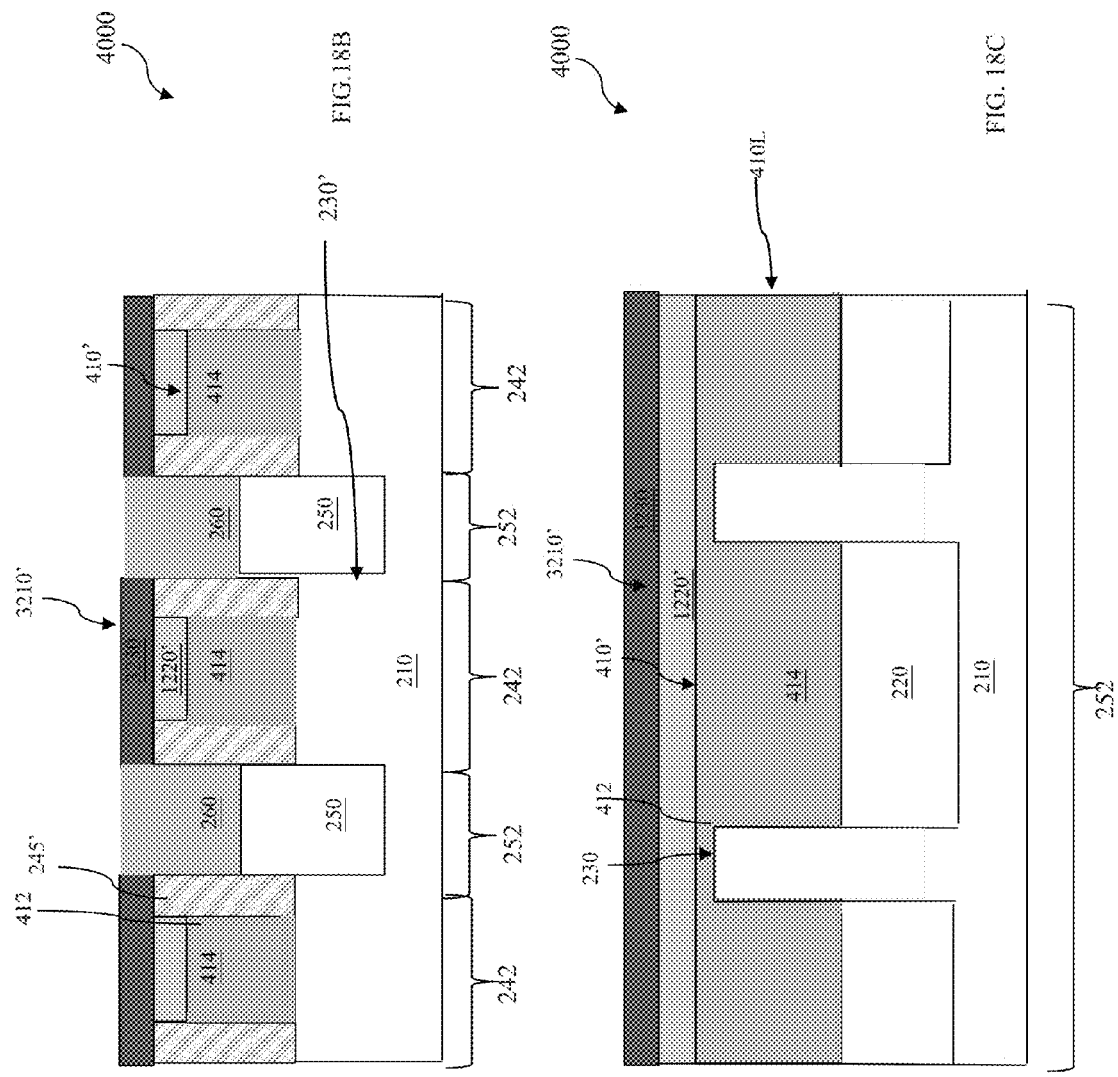

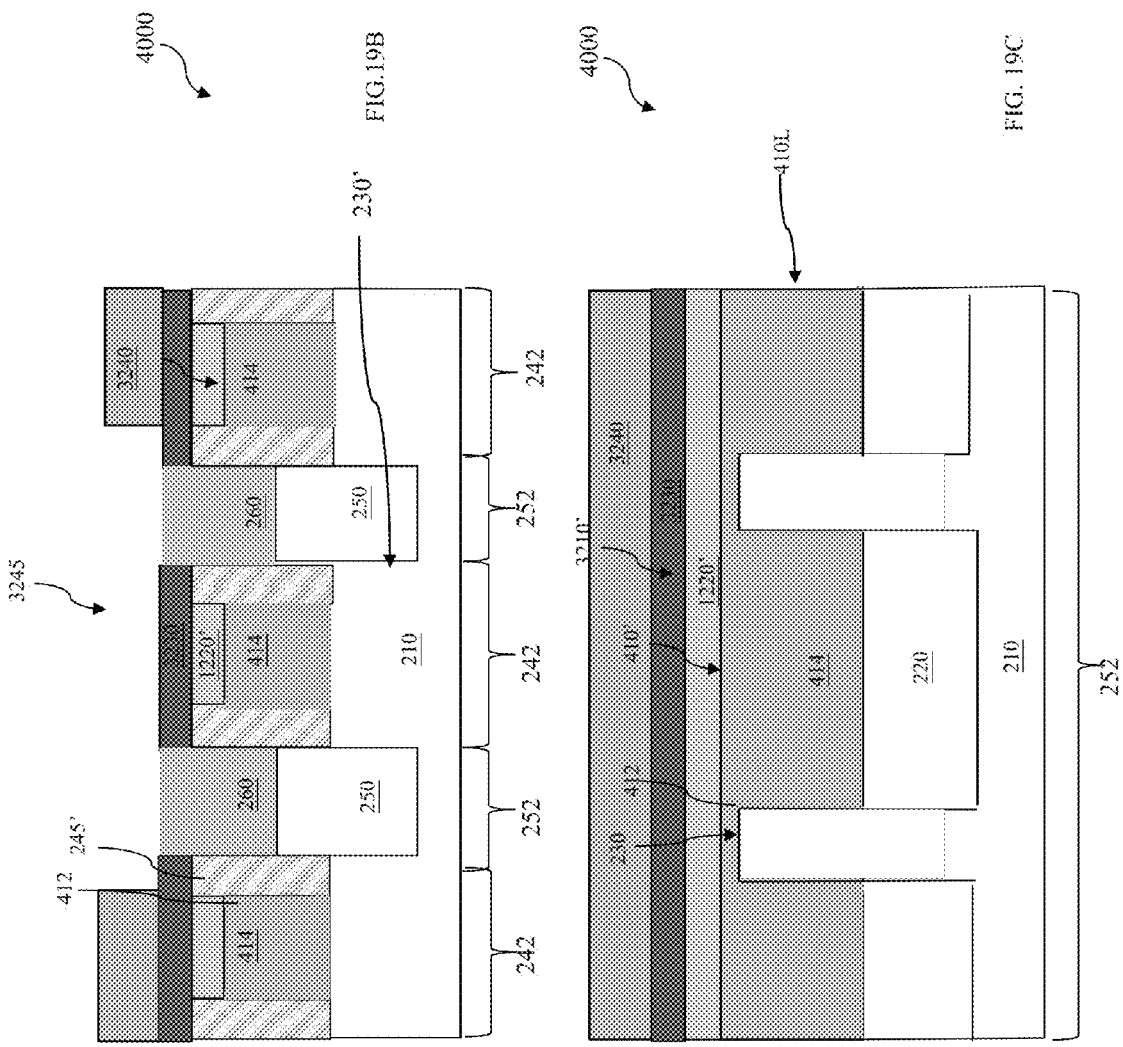

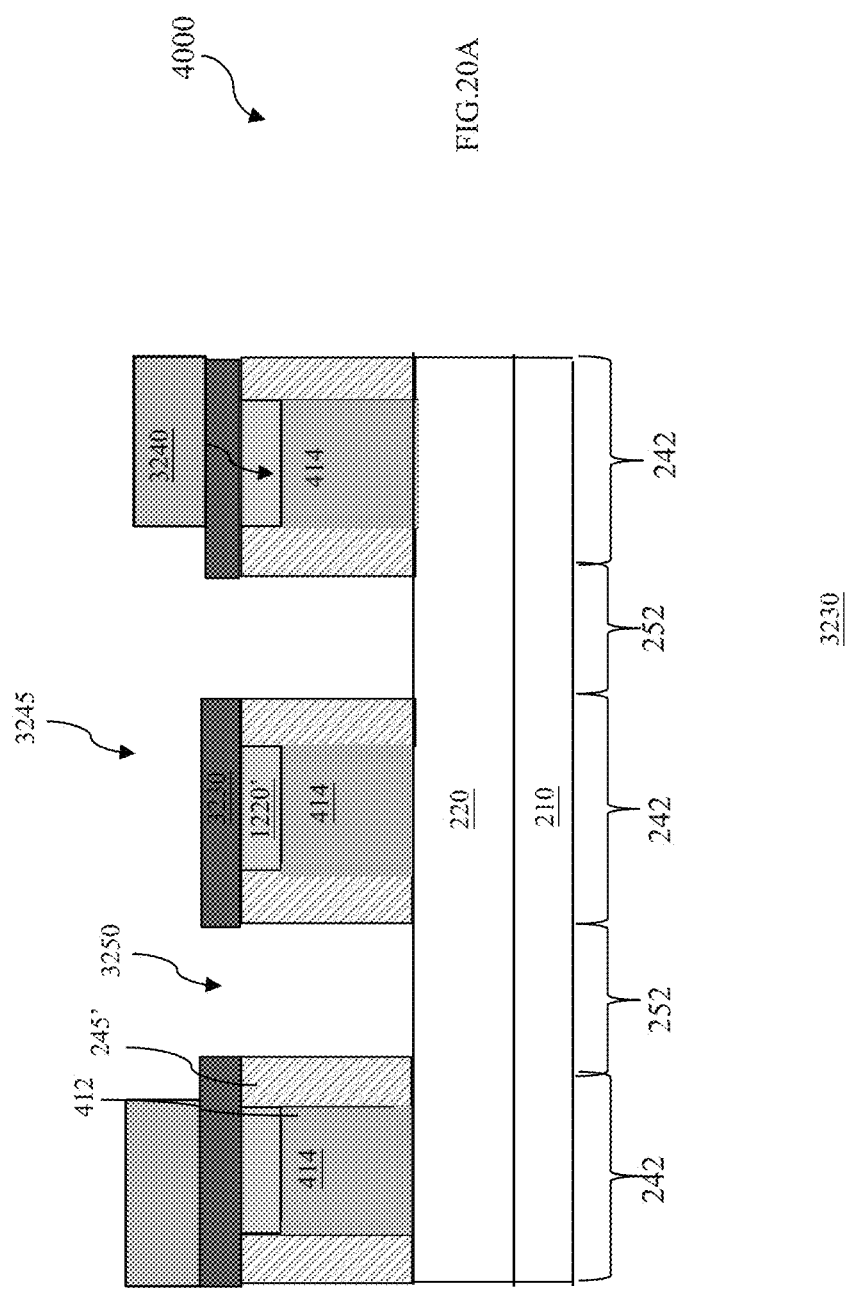

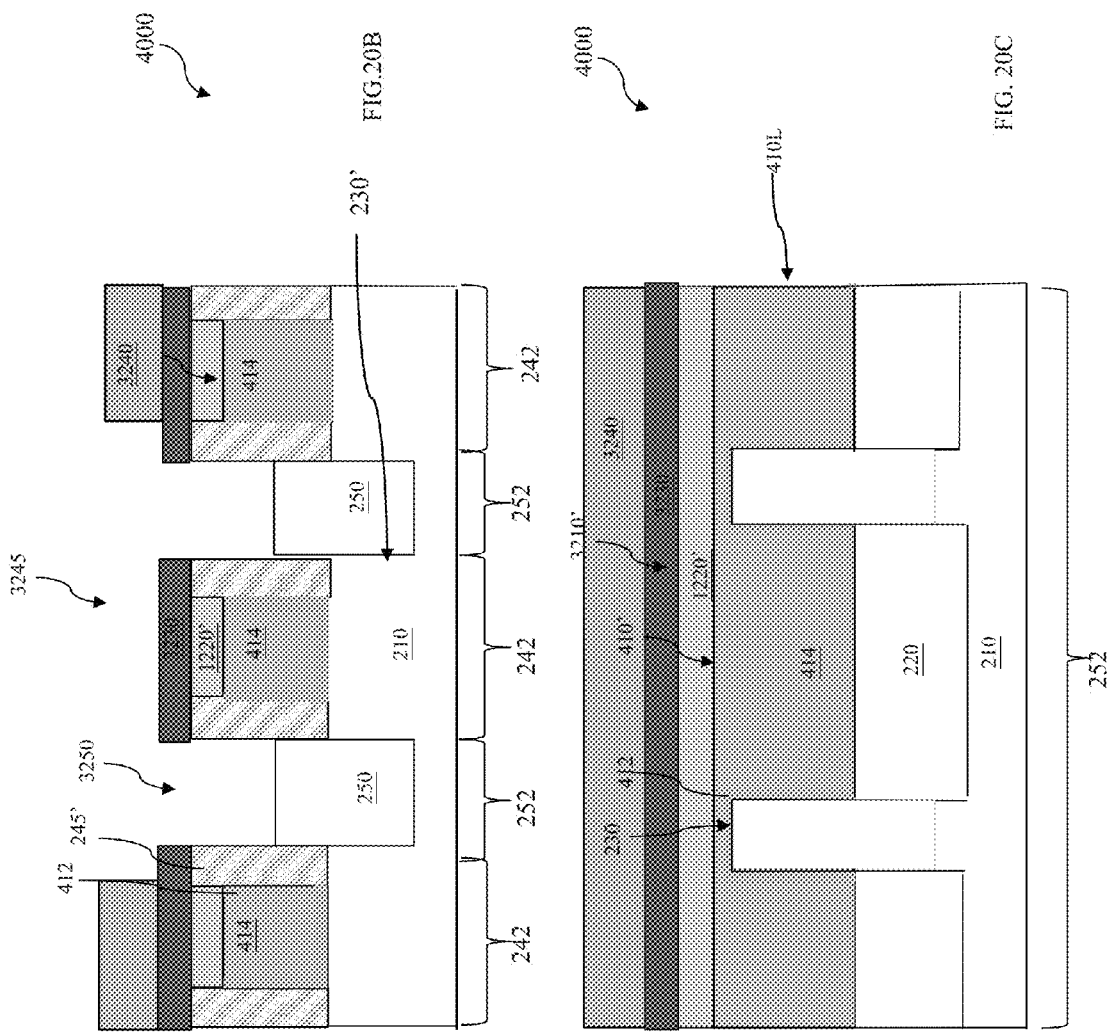

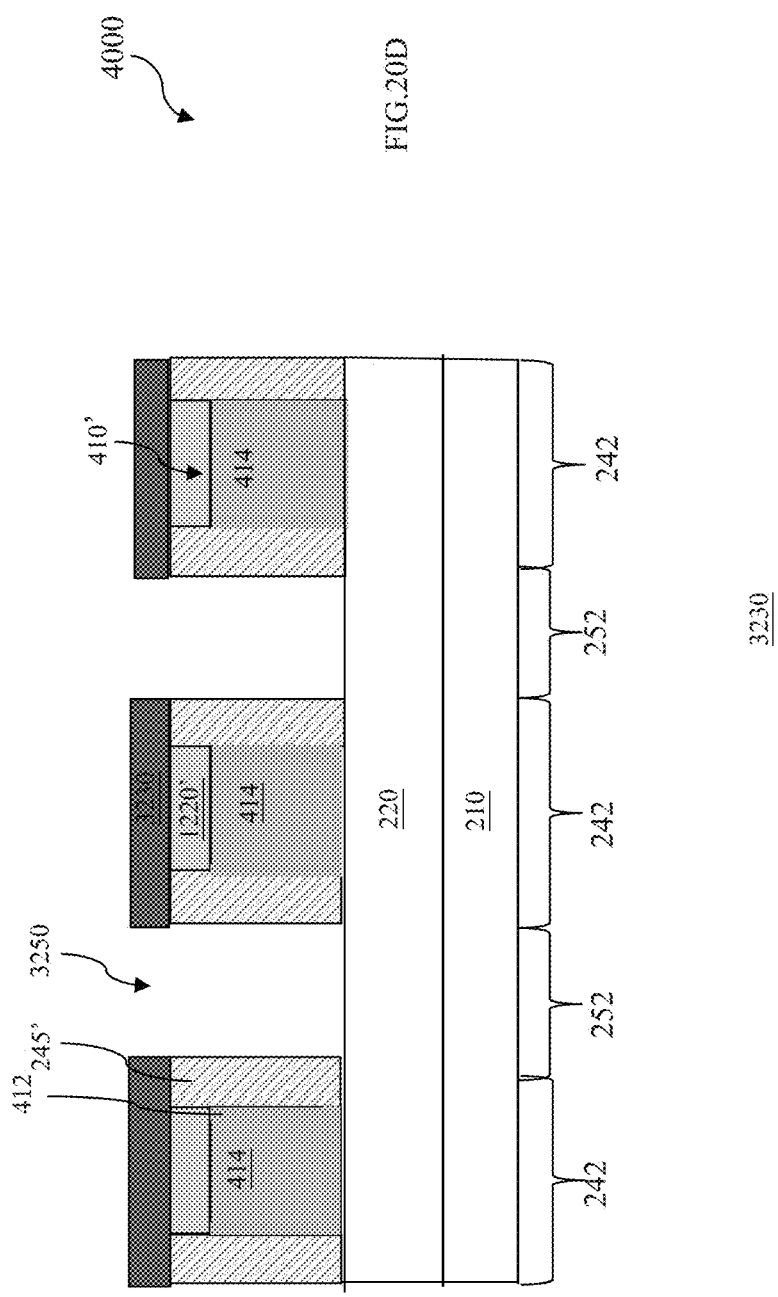

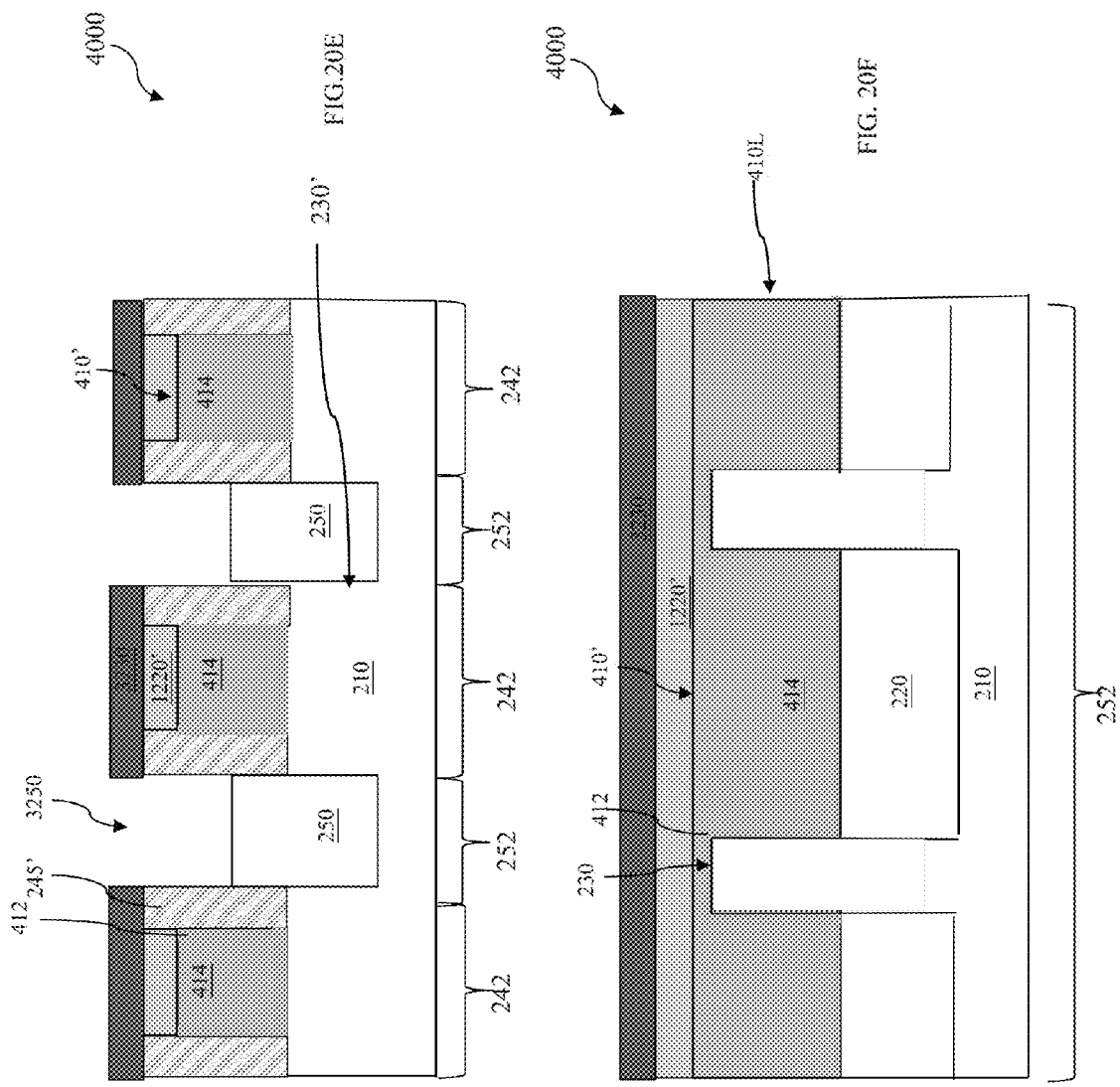

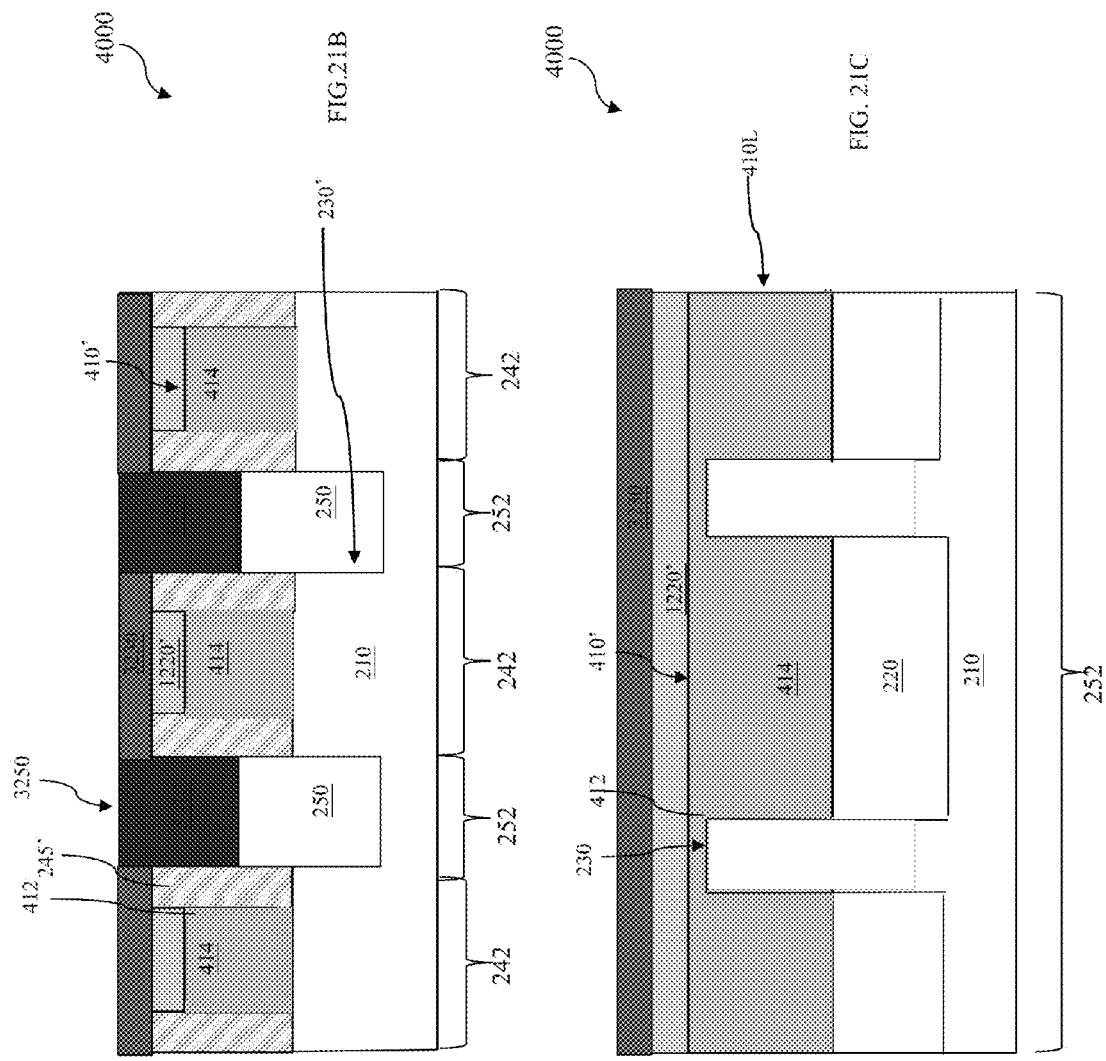

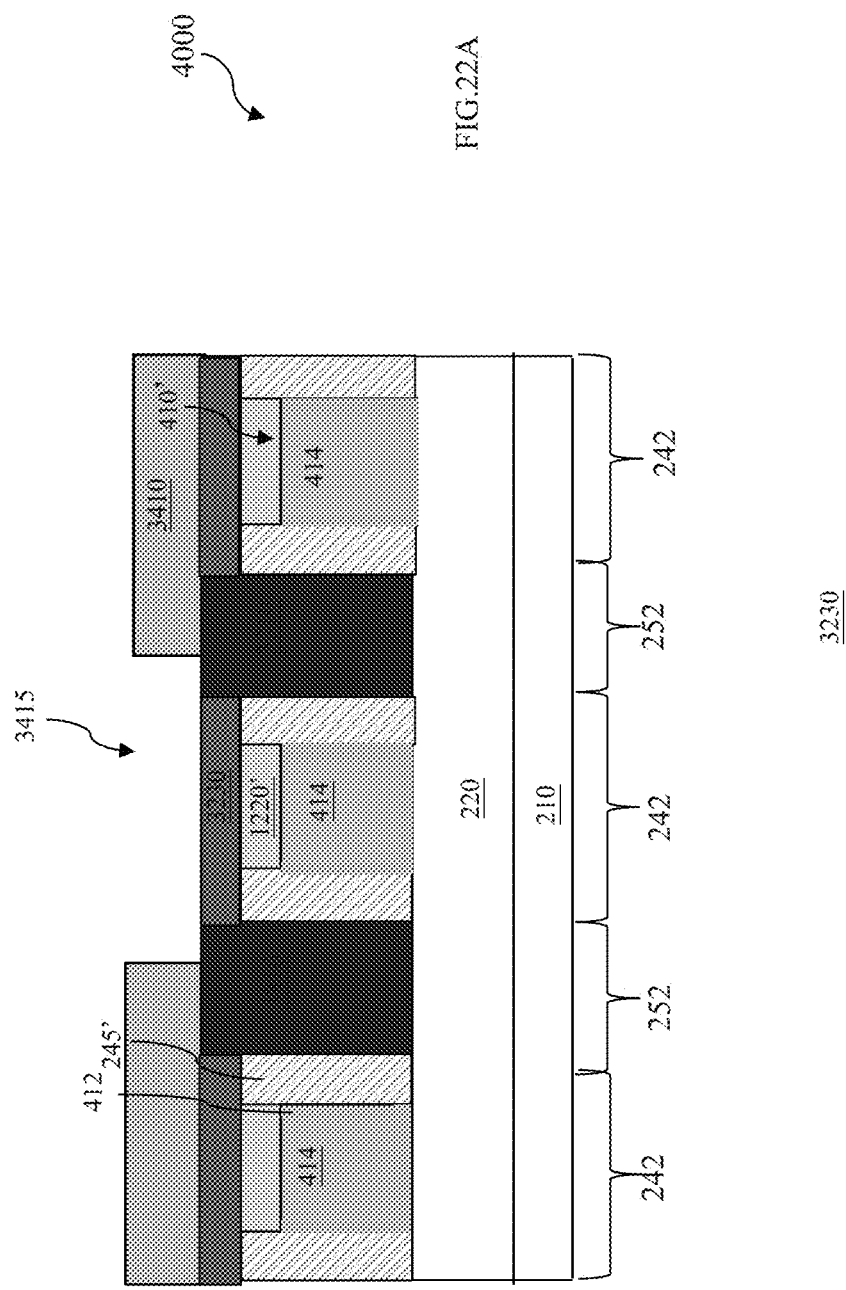

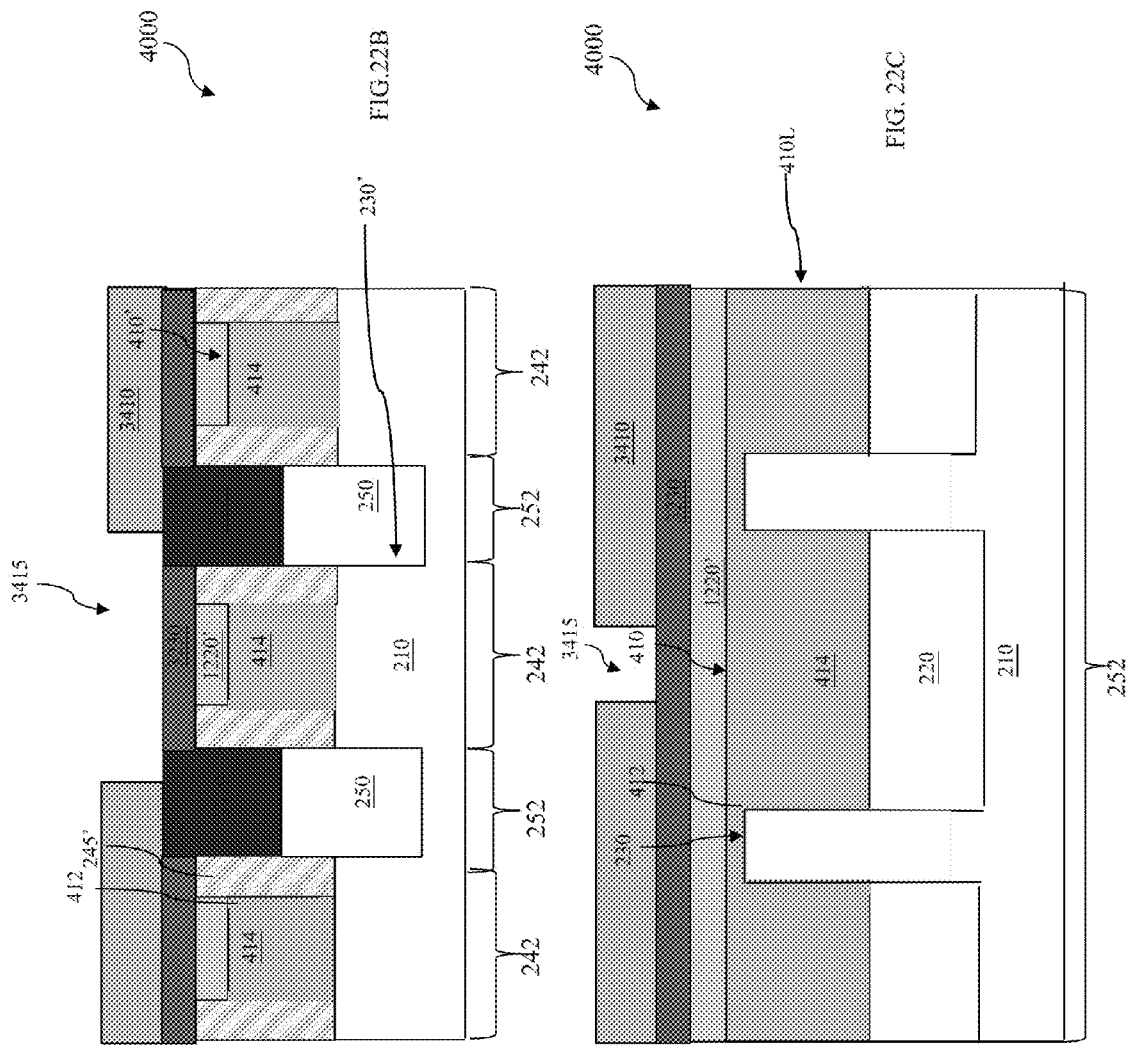

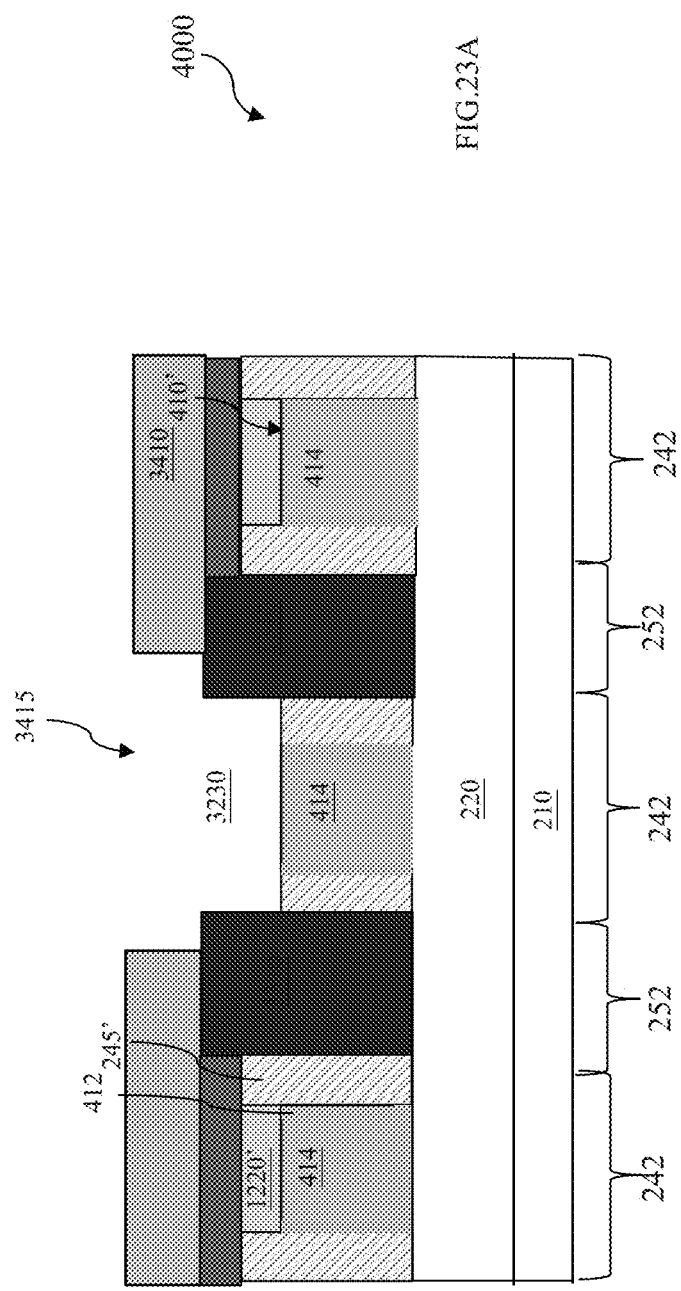

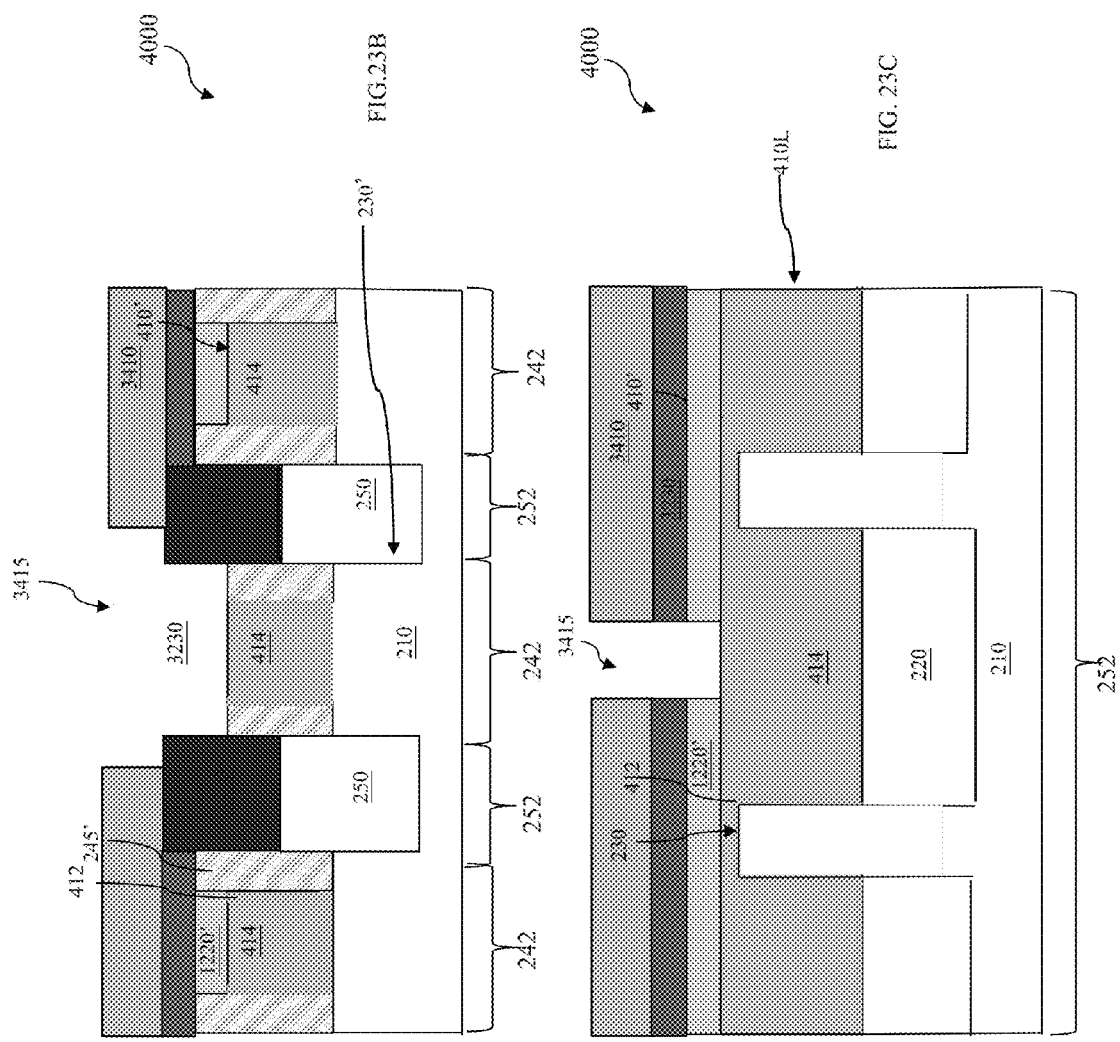

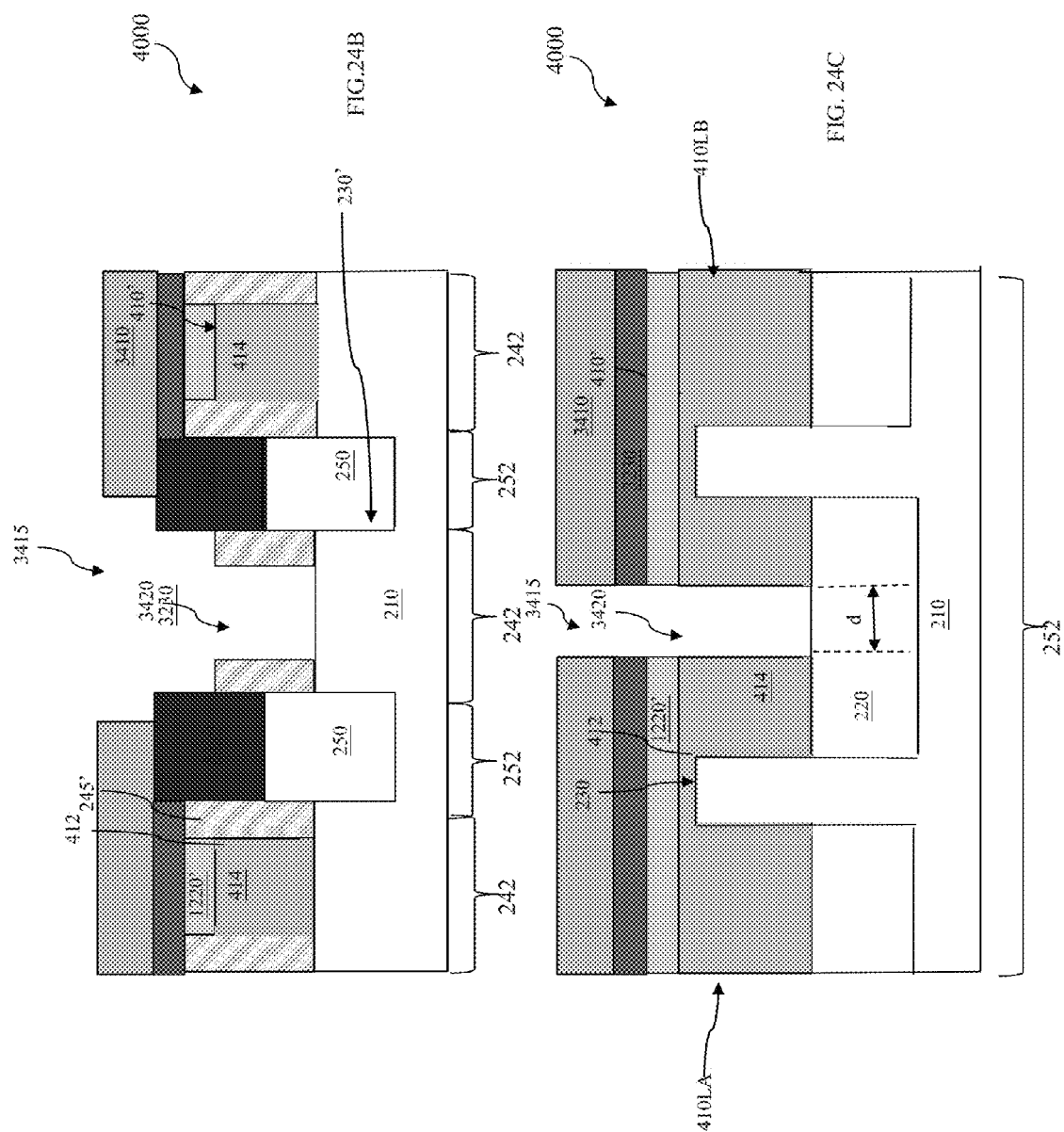

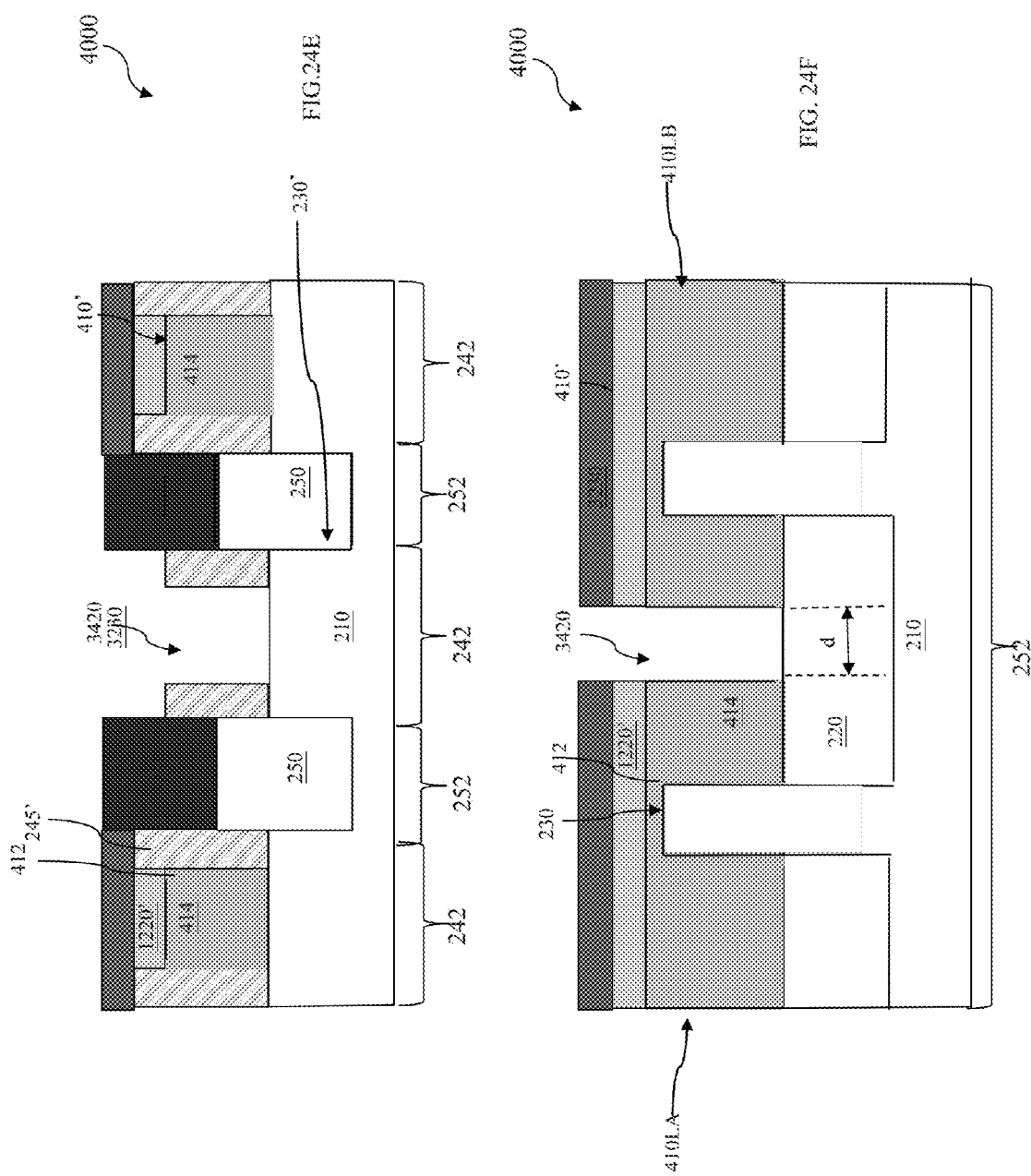

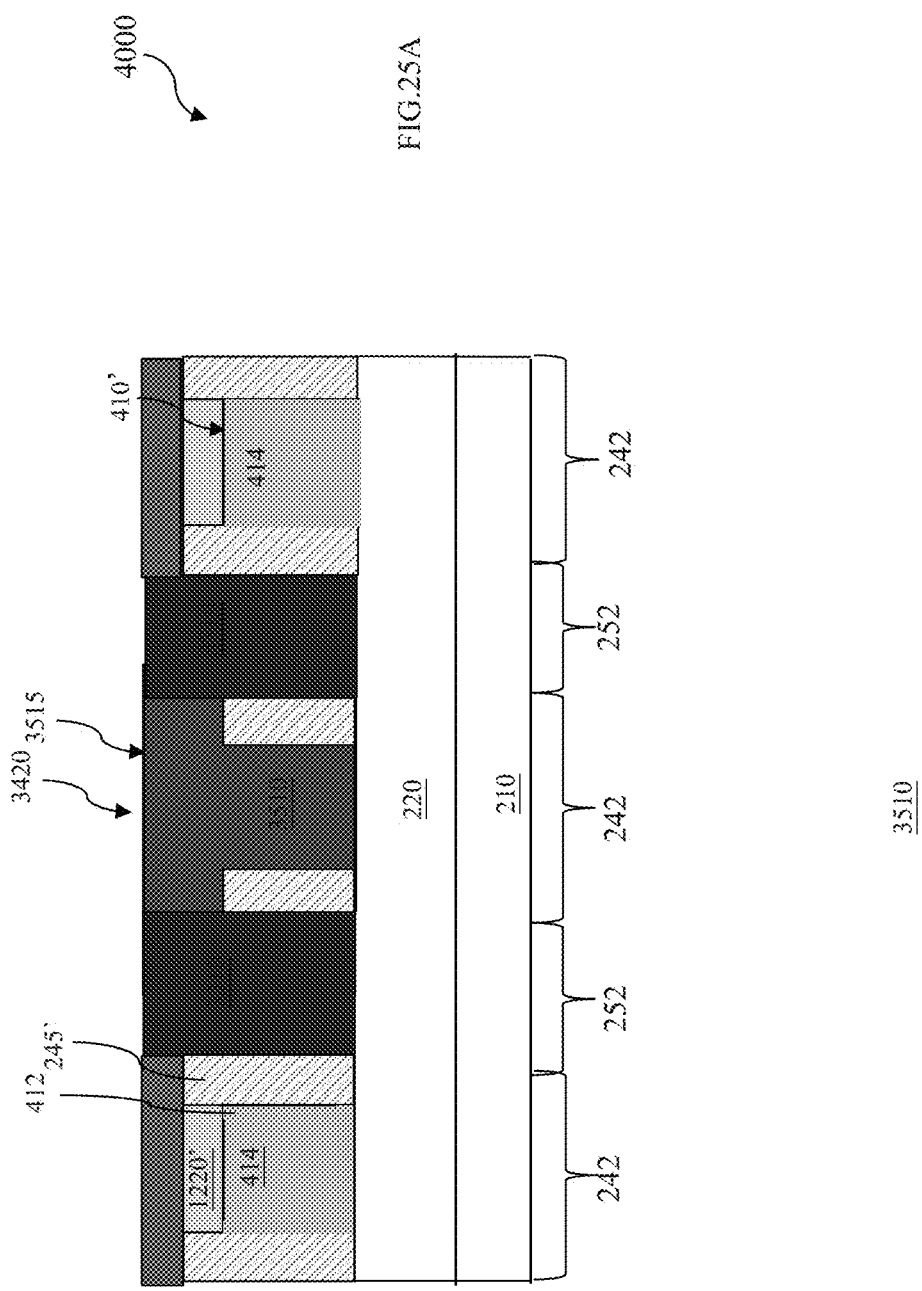

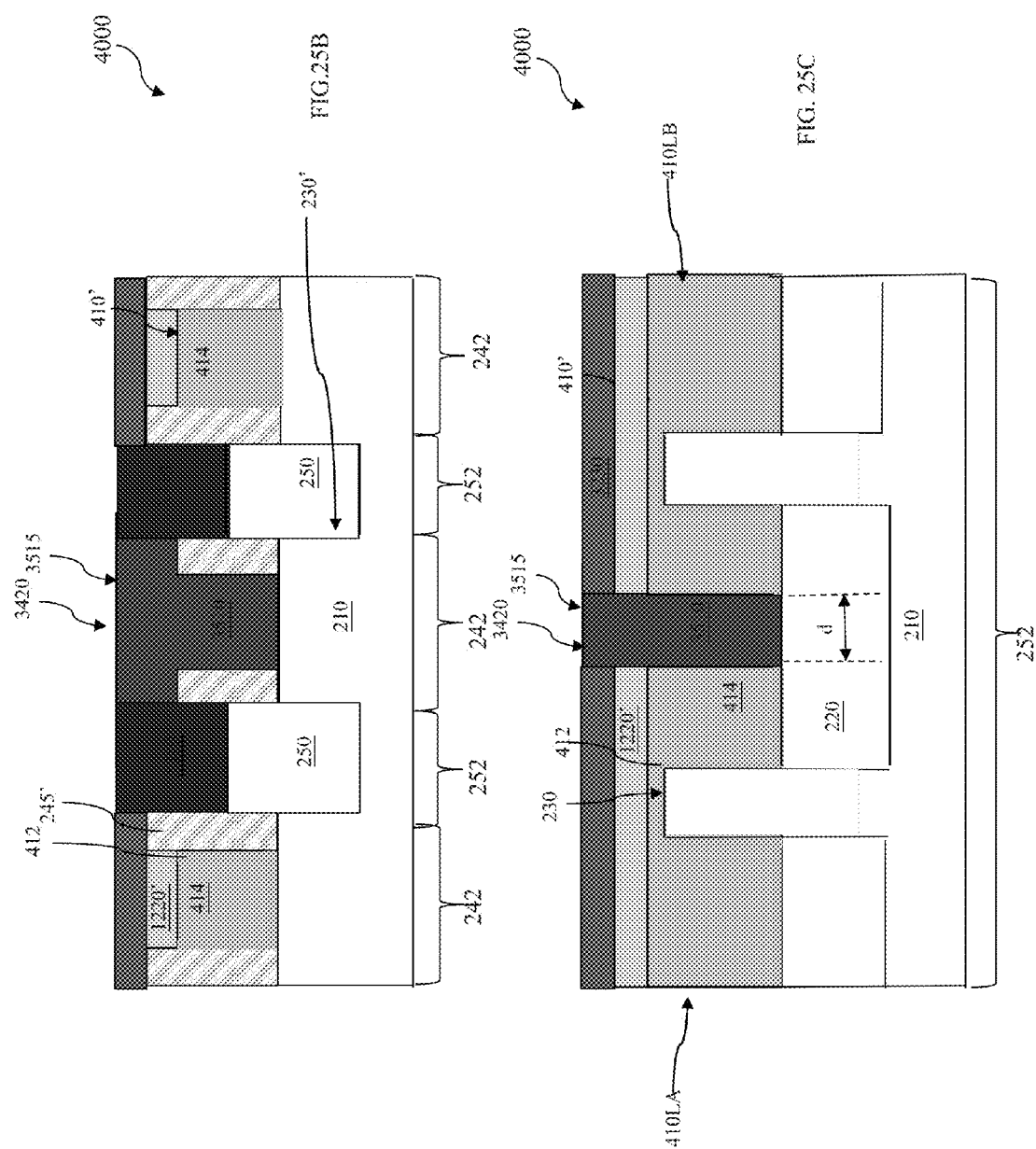

METHOD OF CUTTING METAL GATE

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. Although existing methods of fabricating IC devices have been generally adequate for their intended purposes, they have not been entirely satisfactory in all respects. For example, challenges rise in cutting a metal electrode line into sub-metal electrode lines.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 2B is a cross-sectional view of an example of a work piece of a semiconductor device along the line A-A in FIG. 2A.

FIG. 2C is a cross-sectional view of an example of a work piece of a semiconductor device along the line B-B in FIG. 2A.

FIGS. 3A, 4A, 5A, 6A, 6C and 7A are cross-sectional views of an example semiconductor device in accordance with some embodiments, along the line A-A in FIG. 2A.

FIGS. 3B, 4B, 5B, 6B, 6D and 7B are cross-sectional views of an example semiconductor device in accordance with some embodiments, along the line B-B in FIG. 2A.

FIGS. 9A, 10A, 11A, 12A, 13A, 13C and 14A are cross-sectional views of an example semiconductor device in accordance with some embodiments, along the line A-A in FIG. 2A.

FIGS. 9B, 10B, 11B, 12B, 13B, 13D and 14B are cross-sectional views of an example semiconductor device in accordance with some embodiments, along the line B-B in FIG. 2A.

FIGS. 16A, 17A, 18A, 19A, 20A, 20D, 21A, 22A, 23A, 24A, 24D and 25A are cross-sectional views of an example semiconductor device in accordance with some embodiments, along the line A-A in FIG. 2A.

FIGS. 16B, 17B, 18B, 19B, 20B, 20E, 21B, 22B, 23B, 24B, 24E and 25B are cross-sectional views of an example semiconductor device in accordance with some embodiments, along the line AA-AA in FIG. 2A.

FIGS. 16C, 17C, 18C, 19C, 20C, 20F, 21C, 22C, 23C, 24C, 24F and 25C are cross-sectional views of an example semiconductor device in accordance with some embodiments, along the line B-B in FIG. 2A.

DETAILED DESCRIPTION

Figure 1:
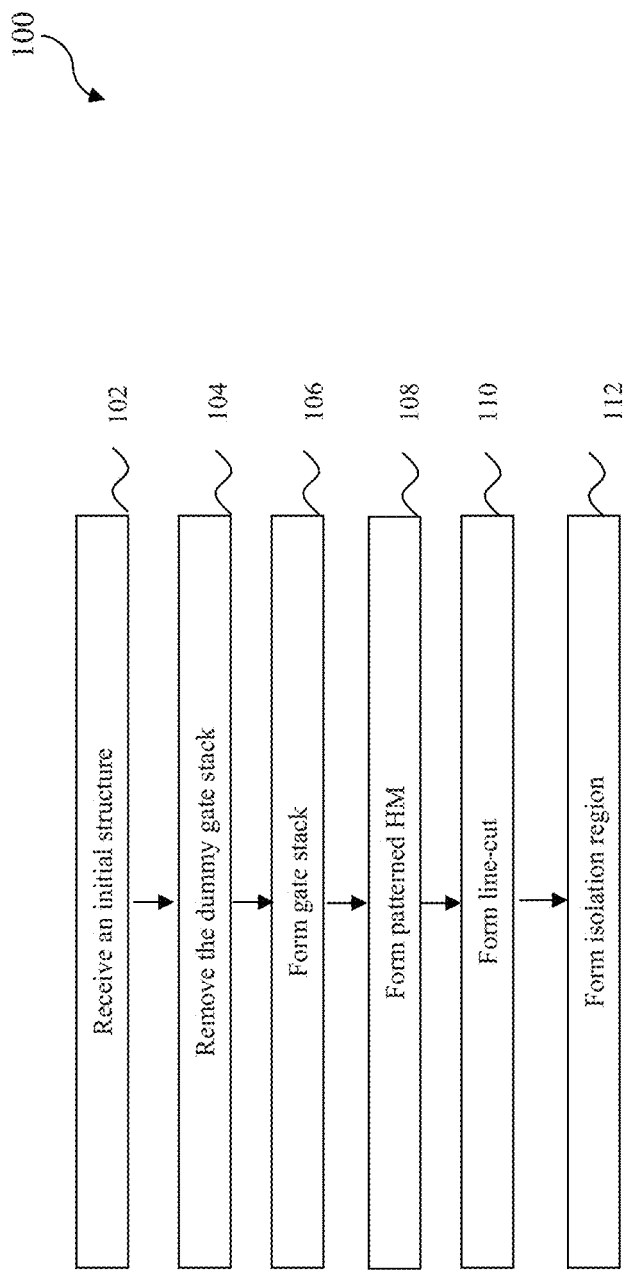
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of device.

FIG. 1 is a flowchart of a method 100 of fabricating one or more semiconductor devices in accordance with some embodiments. Method 100 is discussed in detail below, with reference to a semiconductor device 200, shown in FIGS. 2A through 7B.

Referring to FIGS. 1, 2A, 2B, and 2C, method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, and/or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The workpiece 205 also includes a plurality of fin features 230 formed over the substrate 210. The fin feature 230 may include Si, SiGe, silicon germanium tin (SiGeSn), GaAs, InAs, InP, or other suitable materials. In some embodiments, the fin feature 230 is formed by any suitable process including various deposition, photolithography, and/or etching processes. As an example, the fin feature 230 is formed by patterning and etching a portion of the substrate 210.

The workpiece 205 also includes a plurality of gate stacks 240 in gate regions 242 over the substrate 210, including wrapping over a portion of the fin features 230. In the present embodiment, the gate stack 240 is a dummy gate stack, which will be replaced later by high-k/metal gate (HK/MG). The dummy gate stack 240 may include a dielectric layer, a polysilicon layer. The dummy gate stack 240 may be formed by any suitable process or processes, such as deposition, patterning and etching.

Sidewall spacers 245 are formed along the sidewalls of the dummy gate stack 240. The sidewall spacers 245 may include a dielectric material such as silicon oxide. Alternatively, the sidewall spacers 245 may include silicon nitride, silicon carbide, silicon oxynitride, or combinations thereof. In an embodiment, the sidewall spacers 245 have multiple layers. The sidewall spacers 245 may be formed by depositing a gate sidewall spacer layer and then anisotropic dry etching the gate sidewall spacer layer, known in the art.

The workpiece 205 also includes source/drain (S/D) features 250 in source/drain regions 252 over the substrate 210, beside the dummy gate stack 240 (with the sidewall spacers 245). In some embodiments, the source/drain feature 250 is a source feature, and another source/drain feature 250 is a drain feature. The source/drain features 250 are separated by the dummy gate stack 240. In one embodiment, a portion of the fin feature 230, beside the dummy gate stack 240 is recessed to form S/D recesses and then the S/D features 250 are formed over the S/D recesses by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses are filled with the S/D feature 250, further epitaxial growth of a top layer of the S/D features 250 expands horizontally and facets may start to form, such as a diamond shape facets. The S/D features 250 may be in-situ doped during the epi processes. In some embodiments, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The workpiece 205 also includes an interlayer dielectric (ILD) layer 260 deposited over the substrate 210, including between/over each of the dummy gate stack 240 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than thermal silicon oxide (therefore referred to as low-k dielectric material layer), and/or other suitable dielectric material layer. The ILD layer 260 may include a single layer or multiple layers. A CMP may be performed to polish back the ILD layer 260 to expose a top surface of the dummy gate stack 240.

Figure 2A:
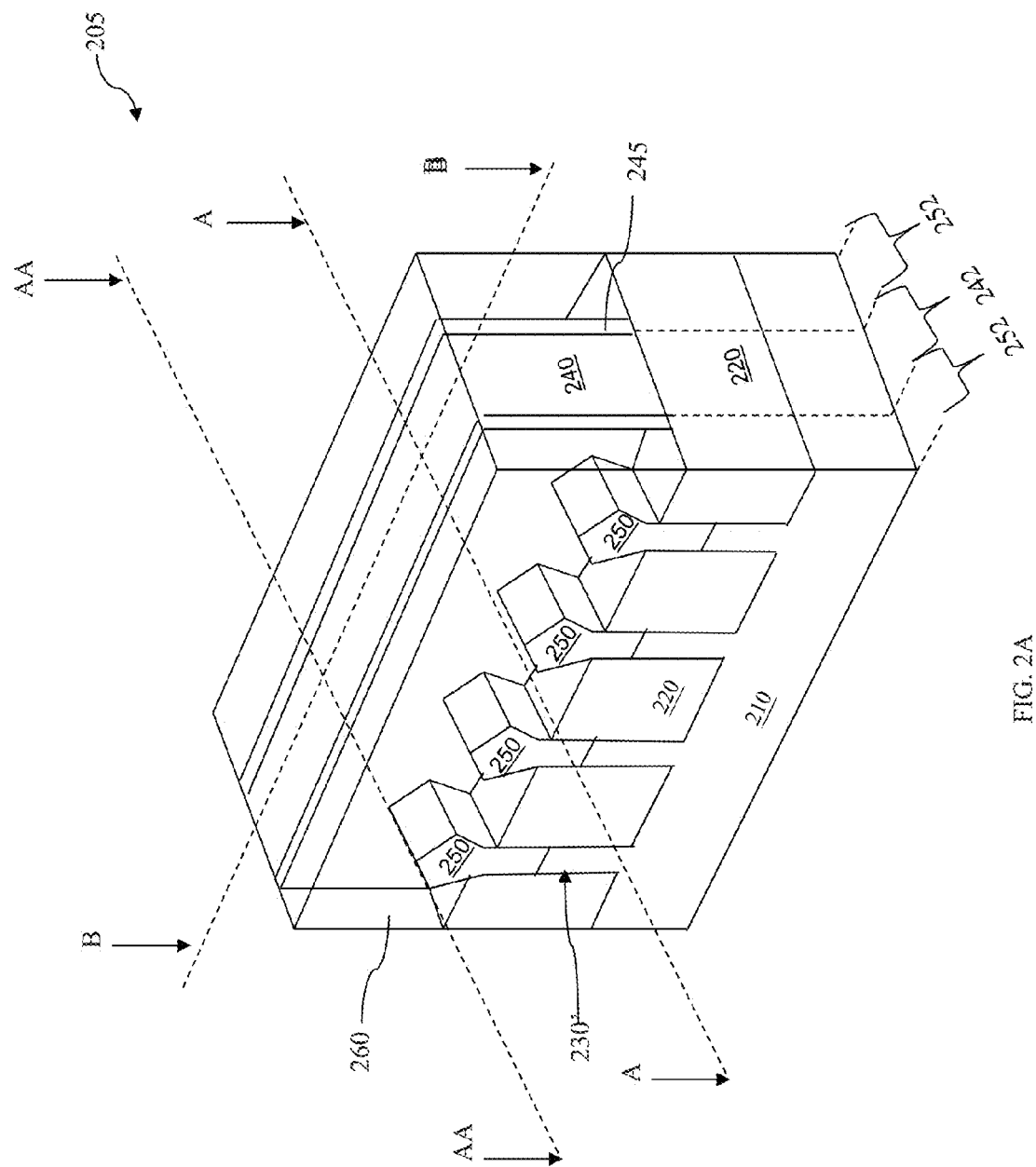
FIG. 2A is a diagrammatic perspective view of an example of a work piece of a semiconductor device in accordance with some embodiments.

It is noted that FIG. 2B is a cross-sectional view of the workpiece 205 along the line A-A in FIG. 2A, which locates between two S/D features 250. FIG. 2C is a cross-section view of the workpiece 205 along the line B-B, which is perpendicular to the line A-A and locates in the gate region 242.

Referring to FIGS. 1, 3A and 3B, once the workpiece 205 is received, method 100 proceeds to step 104 by removing the dummy gate stack 240 to form gate trenches 310. In some embodiments, the etching processes may include a selective wet etch and/or a selective dry etch, having an adequate etch selectivity with respect to the fin feature 230, the sidewall spacer 245 and the ILD layer 260. In one embodiment, a selective wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. In another example a dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching). Alternatively, the dummy gate stacks 240 may be removed by a series of processes including photolithography patterning and etching back.

Referring to FIGS. 1, 4A, and 4B, method 100 proceeds to step 106 by forming gate stacks 410 in the gate trenches 310 of the device 200, including wrapping over upper portions of the fin features 230. A CMP process may be performed to remove excessive metal layer from a gate metal layer 414 hereby provide a substantially planar top surface of the gate metal layer 414. As a result, along the direction of line B-B, the gate stack 410 continually extends from one fin feature 230 to another fin feature 230 to form gate line 410L. The gate stacks 410 may be a high-K/metal gate stack, however other compositions are possible.

In the present embodiment, high-K/metal gate (HK/MG) stacks 410 are formed within the gate trenches 310, including wrapping around the portions of the fin features 230. In various embodiments, the HK/MG stack 410 includes an interfacial layer, a gate dielectric layer 412 formed over the interfacial layer and the gate metal layer 414 formed over the gate dielectric layer 412. The gate dielectric layer, as used and described herein, include dielectric materials having a high dielectric constant, for example, greater than that of thermal silicon oxide (~3.9). The gate metal layer 414 may include a metal, metal alloy, and/or metal silicide. Additionally, the formation of the HK/MG stack 410 may include depositions to form various gate materials, one or more liner layers, and one or more CMP processes to remove excessive gate materials and thereby planarize a top surface of the semiconductor device 200.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric layer 412 may include a high-K dielectric layer such as hafnium oxide ($HfO_2$). Alternatively, the gate dielectric layer 412 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 412 may be formed by ALD, PVD, CVD, oxidation, and/or other suitable methods.

The gate metal layer 414 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate metal layer 414 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate metal layer 414 may be formed by ALD, PVD, CVD, e-beam evaporation, or other suitable process. Further, the gate metal layer 414 may be formed separately for N-FET and P-FET transistors which may use different metal layers. In various embodiments, a CMP process may be performed to remove excessive metal from the gate metal layer 414 hereby provide a substantially planar top surface of the gate metal layer 414.

Referring to FIGS. 1, 5A, and 5B, after forming the HK/MG stack 410, method 100 proceeds to step 108 by forming a patterned hard mask (HM) 510 over the gate metal layer 414. The patterned HM 510 has an opening 515 defining a line-cut to be formed later. A portion of the HK/MG line 410L (HK/MG stack) is exposed within the opening 515. In some embodiments, the opening 515 has a larger width along a direction of line A-A such that adjacent sidewall spacers 245 and the ILD layer 260 are exposed in the opening 515 to obtain advantages, such as relaxing lithography process resolution constrains, especially when the device 200 scales down such that spaces between two adjacent fin features 230 become smaller and smaller.

In some embodiments, the patterned HM 510 may include a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the patterned HM 510 may be formed by depositing a HM layer, forming a patterned photoresist layer over the HM layer by a lithography process and etching the HM material layer through the patterned photoresist layer to form the patterned HM 510.

Referring to FIGS. 1, 6A, and 6B, method 100 proceeds to step 110 by removing the exposed HK/MG stack 410 through the opening 515 to form a line-cut 610. In the present embodiment, the line-cut 610 extends to the isolation features 220 and divides the HK/MG line 410L into two sub-HK/MG lines, 410LA and 410LB. The sub-HK/MG lines 410LA is separated away from the sub-HK/MG line 410LB by a width d of the line-cut 610 along the direction of line B-B.

The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etch process is chosen to selectively etch the HK/MG stack 410 without substantially etching the sidewall spacers 245 and the ILD layer 260. As shown, for circumstances where the portions of the sidewall spacers 245 and the ILD layer 260 are exposed in the opening 515 (as shown in FIGS. 5A and 5B), the exposed portions of the sidewall spacers 245 and the ILD layer 260 together serves as a sub-etch-mask. Thus, the line-cut 610 is formed with a self-alignment nature, which relaxes process constrains.

After forming line-cut 610, the patterned HM 510 is removed by an etch process, as shown in FIGS. 6C and 6D. In one example where the patterned HM 510 is a photoresist pattern, the patterned HM 510 is removed by wet stripping and/or plasma ashing.

Referring to FIGS. 1, 7A, and 7B, method 100 proceeds to step 112 by filling in the line-cut 610 with a dielectric layer 710 to form an isolation region 715 between two sub-HK/MG lines, 410LA and 410LB. The dielectric layer

710 may be deposited by CVD, ALD, spin-on coating, or other suitable techniques. The dielectric layer 710 may include silicon oxide, silicon nitride, oxynitride, a dielectric material having a dielectric constant (k) lower than thermal silicon oxide (therefore referred to as low-k dielectric material layer), and/or other suitable dielectric material layer. A CMP may be performed to polish back the dielectric layer 710 hereby provide a substantially planar top surface of the dielectric layer 710 with respect to the HK/MG stack 410. As a result, the HK/MG line 410L is cut into the sub-HK/MG lines, 410LA and 410LB, and separated by the isolation region 715.

Additional steps can be provided before, during, and after method 100, and some of the steps described can be replaced, eliminated, or moved around for additional embodiments of method 100. Other alternatives or embodiments may present without departure from the spirit and scope of the present disclosure.

Figure 8:
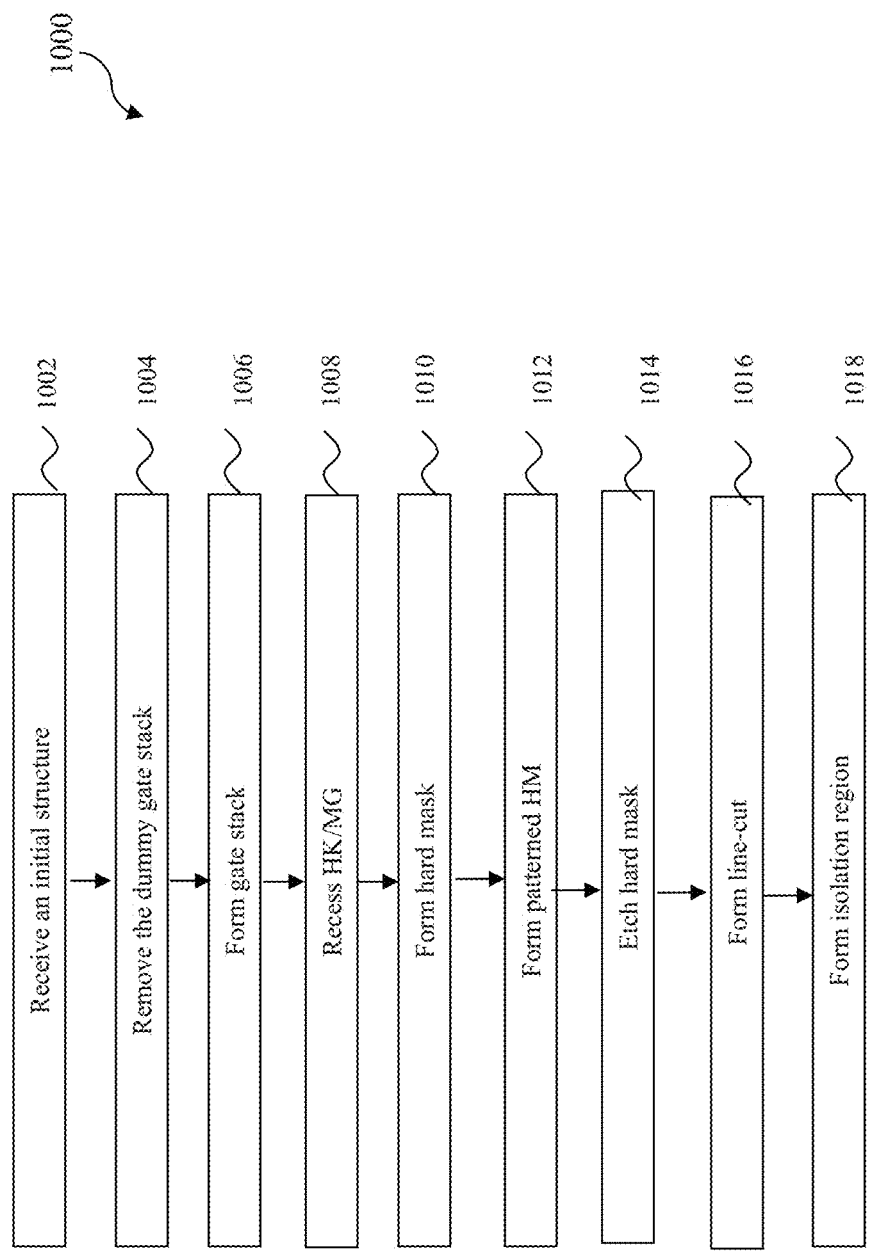
FIG. 8 is a flowchart of another example method for fabricating a semiconductor device constructed in accordance with some embodiments.

FIG. 8 is a method 1000 of semiconductor fabrication including fabrication of a semiconductor device 2000. The steps 1002 through 1006 are similar to those discussed above in steps 102 through 106 of method 100, respectively. Thus, the discussions above with respect to steps 102 through 106 are applicable to the steps 1002 through 1006, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 8, 9A, and 9B, method 1000 proceeds to step 1008 by recessing the HK/MG stack 410 to form sub-trenches 1210 in the gate trenches 310. The remaining HK/MG stack 410 is referred to as HK/MG stacks 410' hereafter. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etch process is chosen to selectively etch the HK/MG stacks 410 without substantially etching the sidewall spacers 245 and the ILD layer 260.

Referring to FIGS. 8, 10A, and 10B, method 1000 proceeds to step 1010 by forming a HM 1220 over the HK/MG stack 410' within the sub-trenches 1210, including over the HK/MG line 410L. In some embodiments, the HM 1220 provides protection for the HK/MG stack 410' in a subsequent S/D-contact-etch process by protecting HK/MG stack 410' during removing the ILD layer 260. The HM 1220 may include silicon nitride, silicon carbide, silicon oxynitride, and/or other suitable material. In the present embodiment, the HM 1220 includes a material which is different from the sidewall spacer 245 and the ILD layer 260 to achieve etching selectivity during subsequent etch processes. In an embodiment, the HM 1220 includes silicon nitride while the sidewall spacers 245 and the ILD layer 260 include silicon oxide. The HM 1220 may be deposited by CVD, ALD, and/or other proper technique. A CMP may be performed to polish back the HM 1220 and hereby provide a substantially planar top surface of the HM 1220 with respect to the ILD layer 260 and the sidewall spacers 245.

Referring to FIGS. 8, 11A, and 11B, after forming the HM 1220 over the HK/MG stack 410', method 1000 proceeds to step 1012 by forming a patterned HM 1230 over the HM layer 1220. The patterned HM layer 1230 has an opening 1235 defining a line-cut to be formed later. The opening 1235 aligns to a designated portion of the HK/MG line 410L (e.g. between two fin features 230), which will be removed later. In some embodiments, the opening 1235 has a larger width along a direction of line A-A such that adjacent sidewall spacers 245 and portions of the ILD layer 260 are exposed within the opening 1235 to obtain advantages, such as relaxing lithography process resolution constrains, especially when the device 2000 scales down such that spaces between two adjacent fin features 230 become smaller and smaller. The patterned HM 1230 is formed similarly in many respects to the patterned HM 510 discussed above association with FIGS. 5A and 5B, including the materials discussed therein.

Referring to FIGS. 8, 12A, and 12B, method 1000 proceeds to step 1014 by removing the HM 1220 through the opening 1235 to expose a portion of the HK/MG stack 410'. The etch process may include a wet etch, a dry etch, and/or a combination thereof. In some embodiments, the etch process is chosen to selectively etch the HM 1220 without substantially etching the sidewall spacers 240 and the ILD layer 260. As shown, for circumstances where the sidewall spacers 245 and portions of the ILD layer 260 are exposed in the opening 1235 (as shown in FIG. 11A), the exposed sidewall spacers 245 and the portions of the ILD layer 260 together serves as a sub-etch-mask. Thus, HM 1220 is removed with a self-alignment nature, which relaxes process constrains.

Referring to FIGS. 8, 13A, and 13B, method 1000 proceeds to step 1016 by removing the exposed HK/MG stack 410' through the opening 1235 to form a line-cut 1240. In the present embodiment, the line-cut 1240 extends to the isolation features 220 and divides the HK/MG line 410L into two sub-HK/MG lines, 410LA and 410LB. The sub-HK/MG lines 410LA is separated away from the sub-HK/MG line 410LB by the width d of the line-cut 1240 along the direction of line B-B of FIG. 2A. The etching process is similar in many respects to the etching process discussed above association with FIGS. 6A and 6B. After forming the line-cut 1240, the patterned HM 1230 is removed by an etch process, as shown in FIGS. 13C and 13D. In one example where the patterned HM 1230 is a photoresist pattern, the patterned HM 1230 is removed by wet stripping and/or plasma ashing.

Referring to FIGS. 8, 14A, and 14B, method 1000 proceeds to step 1018 by filling in the line-cut 1240 with a dielectric layer 1250 to form an isolation region 1255 between two sub-HK/MG lines, 410LA and 410LB. The dielectric layer 1250 is formed similarly in many respects to the dielectric layer 710 discussed above association with FIGS. 7A and 7B, including the materials discussed therein. A CMP may be performed to polish back the dielectric layer 1250 and hereby provide a substantially planar top surface of the dielectric layer 1250 with respect to a top surface of the HM 1220. As a result, the HK/MG line 410L is cut into the sub-HK/MG lines, 410LA and 410LB, and separated by the isolation region 1255.

Additional steps can be provided before, during, and after method 1000, and some of the steps described can be replaced, eliminated, or moved around for additional embodiments of method 1000. Other alternatives or embodiments may present without departure from the spirit and scope of the present disclosure.

Figure 15:
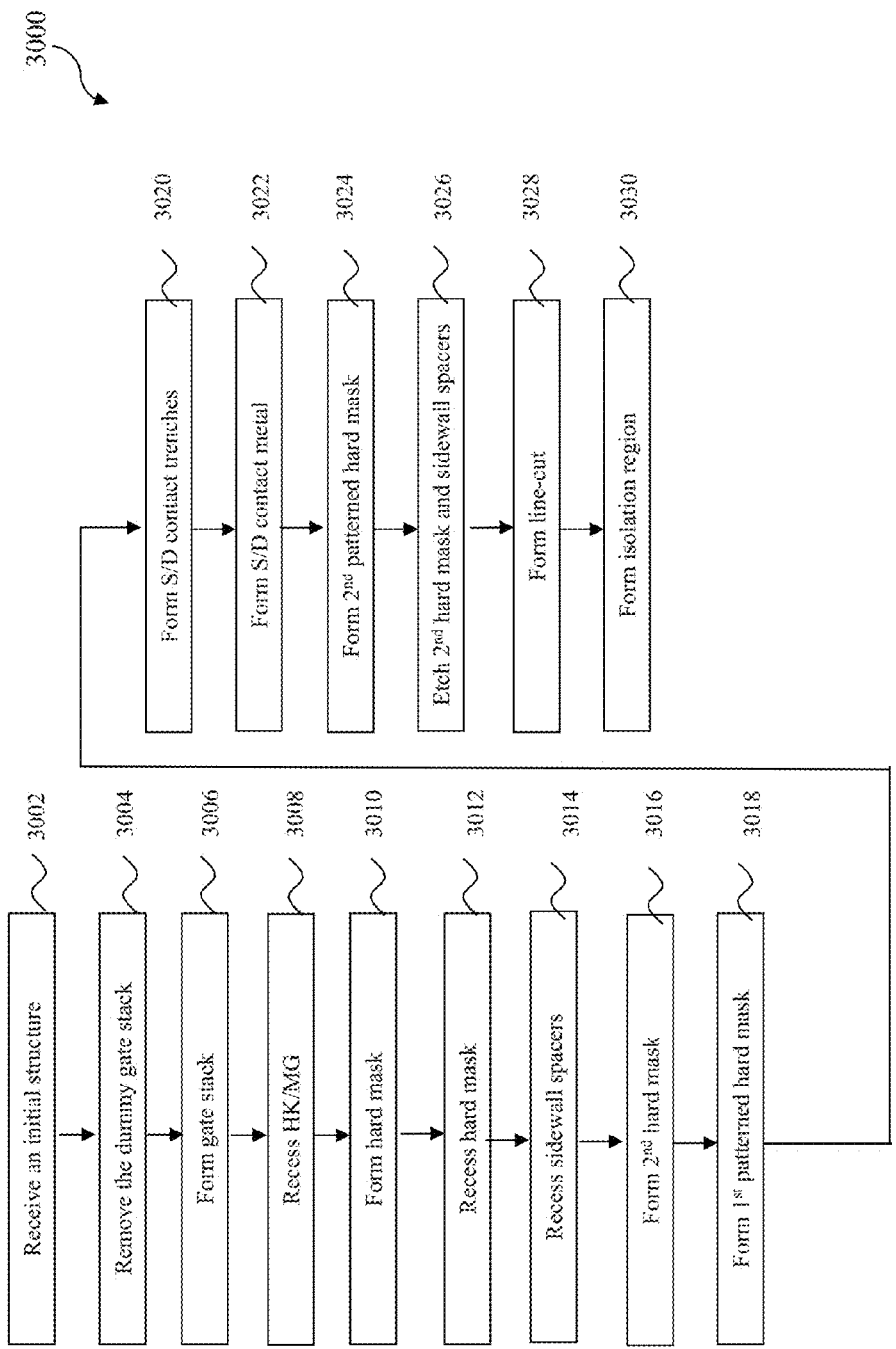
FIG. 15 is a flowchart of another example method for fabricating a semiconductor device constructed in accordance with some embodiments.
Figure 16A:
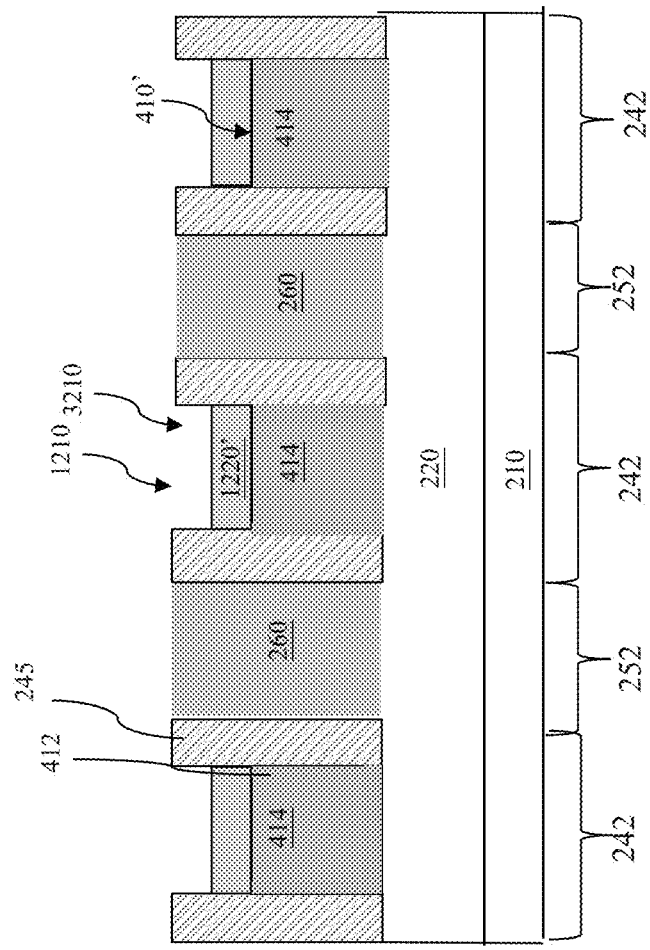
Figure 17A:
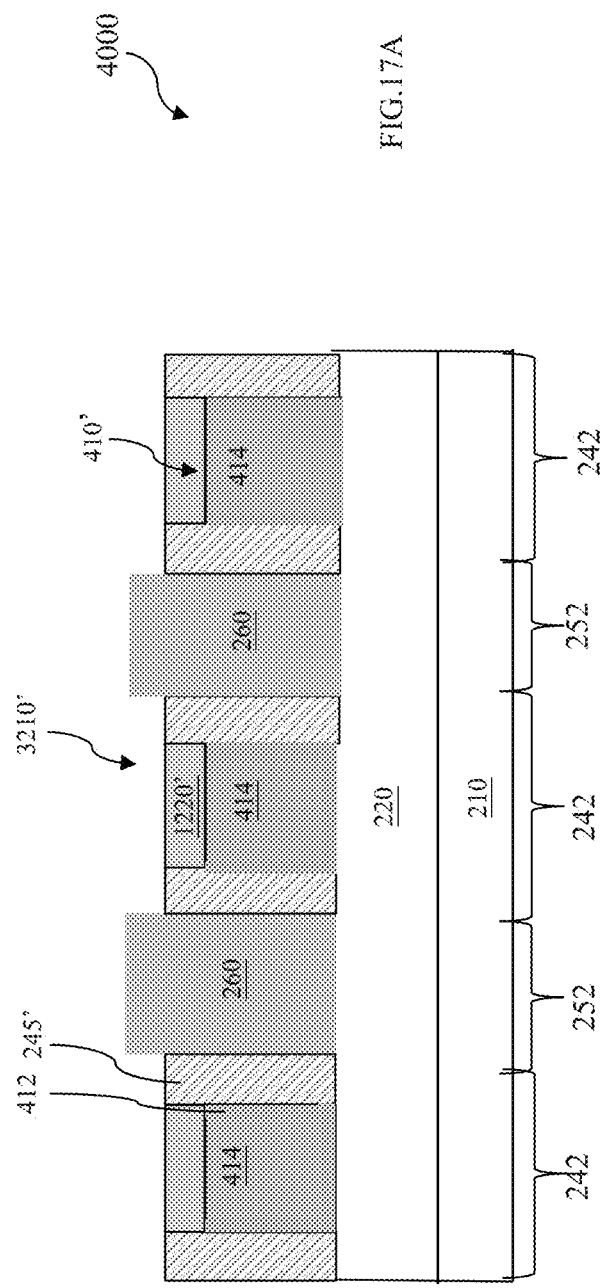

FIG. 15 is a method 3000 of semiconductor fabrication including fabrication of a semiconductor device 4000. The steps 3002 through 3006 are similar to those discussed above in steps 102 through 106 of method 100, respectively. The steps 3008 and 3010 are similar to those discussed above in steps 1008 and 1010 of method 1000, respectively. Thus, the discussions above with respect to steps 102 through 106 are applicable to the steps 1002 through 1006, respectively. Similarly, the discussions above with respect to steps 1008 and 1010 are applicable to the steps 3008 and 3010, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 15, 16A, 16B and 16C, after forming the HM 1220 in the sub-trench 1210, method 3000 proceeds to step 3012 by recessing the HM 1220 to form first trenches 3210. The recessed HM 1220 is referred to as 1220'. The etch process to recess HM 1220 may include a wet etch, a dry etch, and/or a combination thereof. In some embodiments, the etch process is chosen to selectively etch the first HM 1220 without substantially etching the sidewall spacers 245 and the ILD layer 260. Thus, first trenches 3210 are formed with a self-alignment nature, which relaxes process constrains.

Referring to FIGS. 15, 17A, 17B and 17C, method 3000 proceeds to step 3014 by recessing the sidewall spacers 245 to expand (or enlarge) the first trench 3210 wider, also referred to as 3210' (or second trench 3210'). The etch process may include a wet etch, a dry etch, and/or a combination thereof. In some embodiments, the etch process is chosen to selectively etch the sidewall spacers 245 without substantially etching the ILD layer 260 and the HM layer 1220. Thus, the expended first trenches 3210' are formed with a self-alignment nature, which relaxes process constrains. The recessed sidewall spacers 245 are referred to as 245'. In some embodiments, the etch process is controlled such that top surfaces of recessed sidewall spacers 245' are substantial coplanar with a top surface of the HM 1220'.

Referring to FIGS. 15, 18A, 18B and 18C, method 3000 proceeds to step 3016 by forming a second HM 3230 within the first trenches 3210' (or second trenches 3210'). In some embodiments, the second HM 3230 covers the HM 1220' and extends to cover the sidewall spacer 245' to enhance protection for the HK/MG stack 410' in subsequent etching process, such as by protecting recessed HK/MG stack 410' during removing the ILD layer 260 in a subsequent S/D-contact-etch process, and improving allowance for subsequent S/D-contact-lithography process.

The second HM 3230 is formed similarly in many respects to the HM 1220 discussed above association with FIGS. 10A and 10B, including the materials discussed therein. In the present embodiment, the second HM 3230 includes a material which is different from the ILD layer 260 to achieve etching selectivity during subsequent etch processes. Additionally, a CMP is performed to recess the excessive second HM 3230.

Referring to FIGS. 15, 19A, 19B and 19C, method 3000 proceeds to step 3018 by forming a first patterned HM 3240 over the second HM 3230. The first patterned HM 3240 has an opening 3245 defining S/D contacts to be formed later. The opening 3245 aligns to the ILD 260 over designated S/D features 250. In some embodiments, the opening 3245 has a greater width along a direction of line A-A such that adjacent second HM 3230 are exposed within the opening 3245 to obtain advantages, such as relaxing lithography process resolution constrains, especially when the device 4000 scales down such that spaces between two adjacent fin features 230 become smaller and smaller. The first patterned HM 3240 is formed similarly in many respects to the patterned HM 510 discussed above association with FIGS. 5A and 5B, including the materials discussed therein.

Figure 19A:
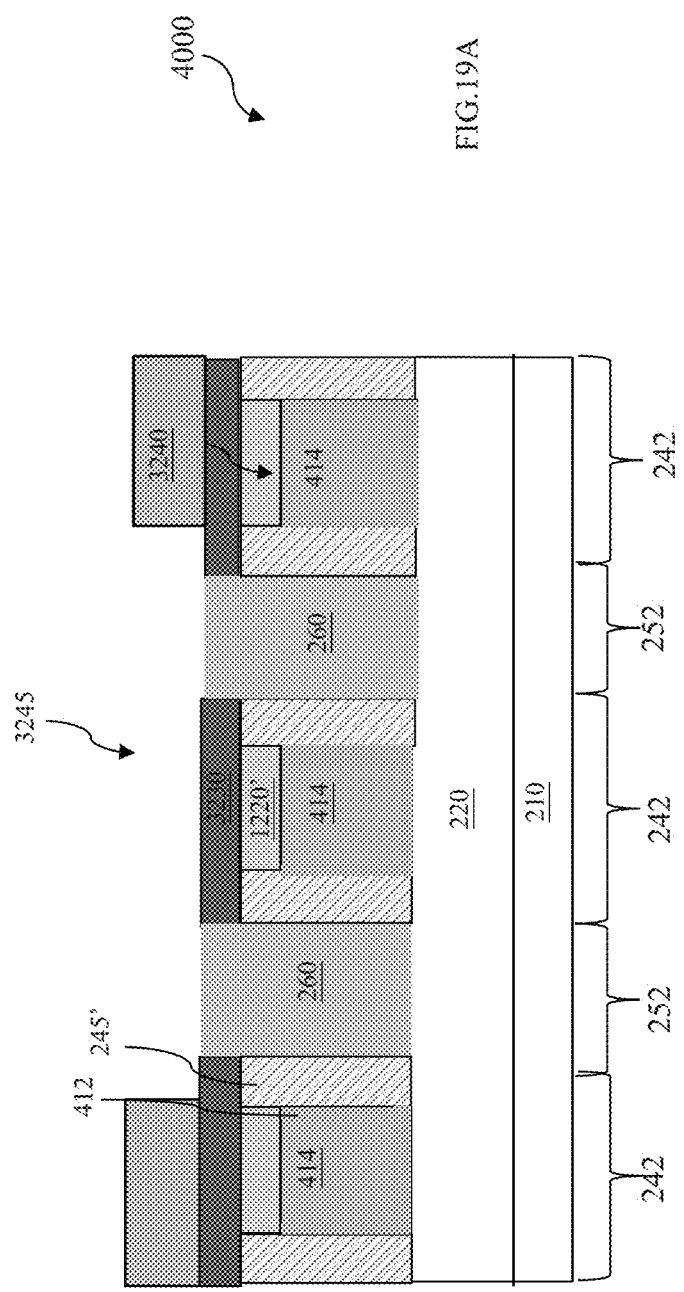
Figure 21A:
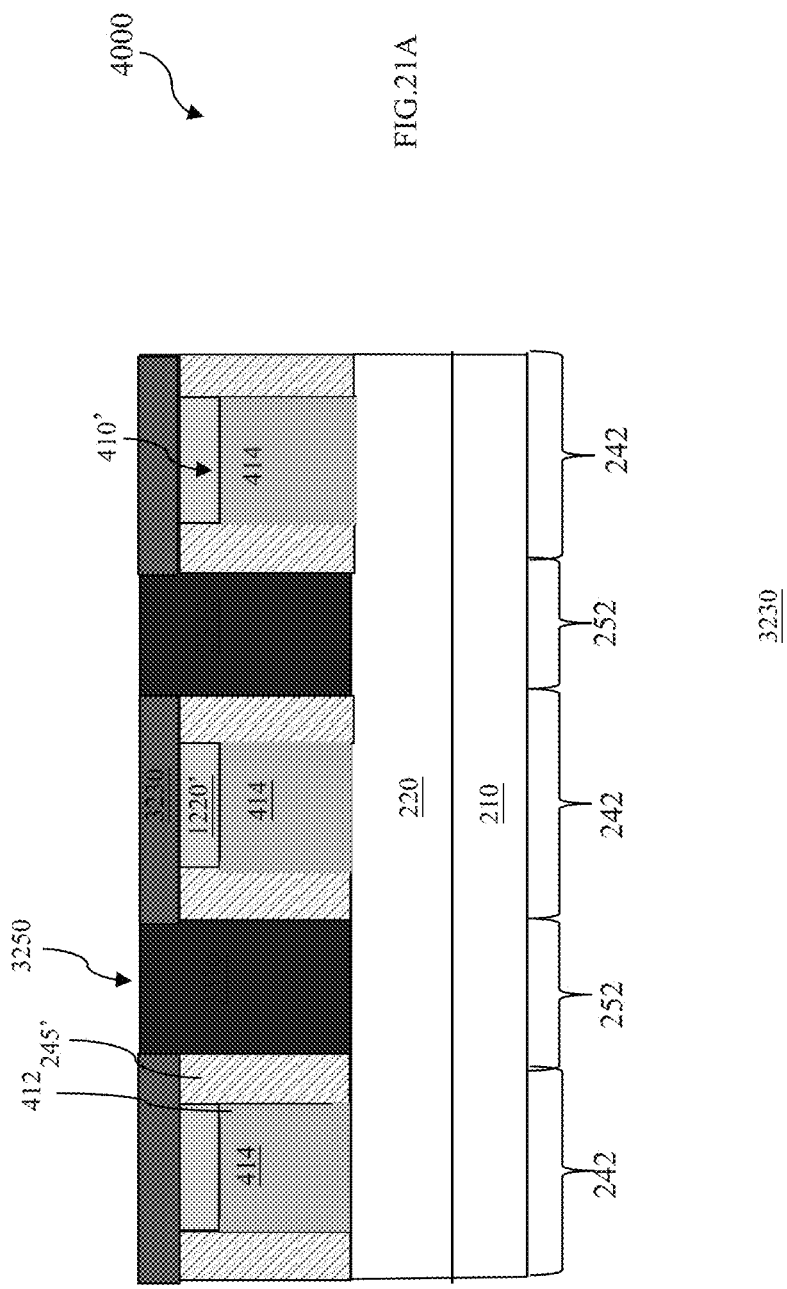

Referring to FIGS. 15, 20A, 20B and 20C, method 3000 proceeds to step 3020 by removing the ILD layer 260 through the opening 3245 to form S/D contact trenches 3250. Therefore designated S/D features 250 are exposed within the S/D contact trench 3250. As has been mentioned previously, the trench etch process is chosen to selectively remove the ILD layer 260 without substantially etching the second HM 3230. As shown, for circumstances where portions of the second HM 3230 are exposed in the opening 3245 (as shown in FIGS. 19A, 19B and 19C), second HM 3230 serves as a sub-etch-mask. Thus, S/D contact trenches 3250 are formed with a self-alignment nature, which relaxes process constrains. The trench etch may include a selective wet etch, a selective dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$.

After forming the S/D contact trenches 3250, the first patterned HM 3240 is removed by an etch process, as shown in FIGS. 20D, 20E and 20F. In one example where the first patterned HM 3240 is a photoresist pattern, the first patterned HM 3240 is removed by wet stripping and/or plasma ashing.

Referring to FIGS. 15, 21A, 21B and 21C, method 3000 proceeds to step 3022 by depositing a conductive layer in the S/D contact trenches 3250 to form S/D contact metal 3310. As shown, the S/D contact metal 3310 extends within the S/D contact trenches 3250 to S/D features 250. The S/D contact metal 3310 may include copper (Cu), aluminum (Al), tungsten (W), copper, copper magnesium (CuMn), copper aluminum (CuAl) or copper silicon (CuSi), and/or other suitable conductive material. The S/D contact metal 3310 may be formed by PVD, CVD, metal-organic chemical vapor deposition (MOCVD), or plating. In some embodiments, a CMP process is performed to remove excessive the S/D contact metal 3310 from the second HM 3230 hereby provide a substantially coplanar top surface with a top surface of the second HM 3230.

Referring to FIGS. 15, 22A, 22B and 22C, after forming the S/D contact metal 3310, method 3000 proceeds to step 3024 by forming a second patterned HM 3410 over the second HM 3230 and the S/D contact metal 3310. The second patterned HM 3410 has an opening 3415 defining a line-cut to be formed later. The opening 3415 aligns to a designated portion of the HK/MG line 410L (e.g. between two fin features 230), which will be removed later. In some embodiments, the opening 3415 has a larger width along a direction of line A-A such that adjacent recessed sidewall spacers 245' and portions of the S/D contact metal 3310 are within the opening 3415 to obtain advantages, such as relaxing lithography process resolution constrains, especially when the device 4000 scales down such that spaces between two adjacent fin features 230 become smaller and smaller. The second patterned HM 3410 is formed similarly in many respects to the patterned HM 510 discussed above association with FIGS. 5A and 5B, including the materials discussed therein.

Referring to FIGS. 15, 23A, 23B and 23C, method 3000 proceeds to step 3026 by removing the second HM 3230, the HM 1220' and the sidewall spacers 245' through the opening 3415 to expose a designated portion of the HK/MG stack 410'. The etch process may include a wet etch, a dry etch, and/or a combination thereof. In some embodiments, the etch process is chosen to selectively etch the second HM 3230 and the sidewall spacers 245' without substantially etching the HK/MG stack 410' and the S/D contact metal 3310. As shown, for circumstances where the portions of S/D contact metal 3310 are exposed in the opening 3415 (as shown in FIGS. 22A and 22B), the S/D contact metal 3310 serves as a sub-etch-mask.

Figure 24A:
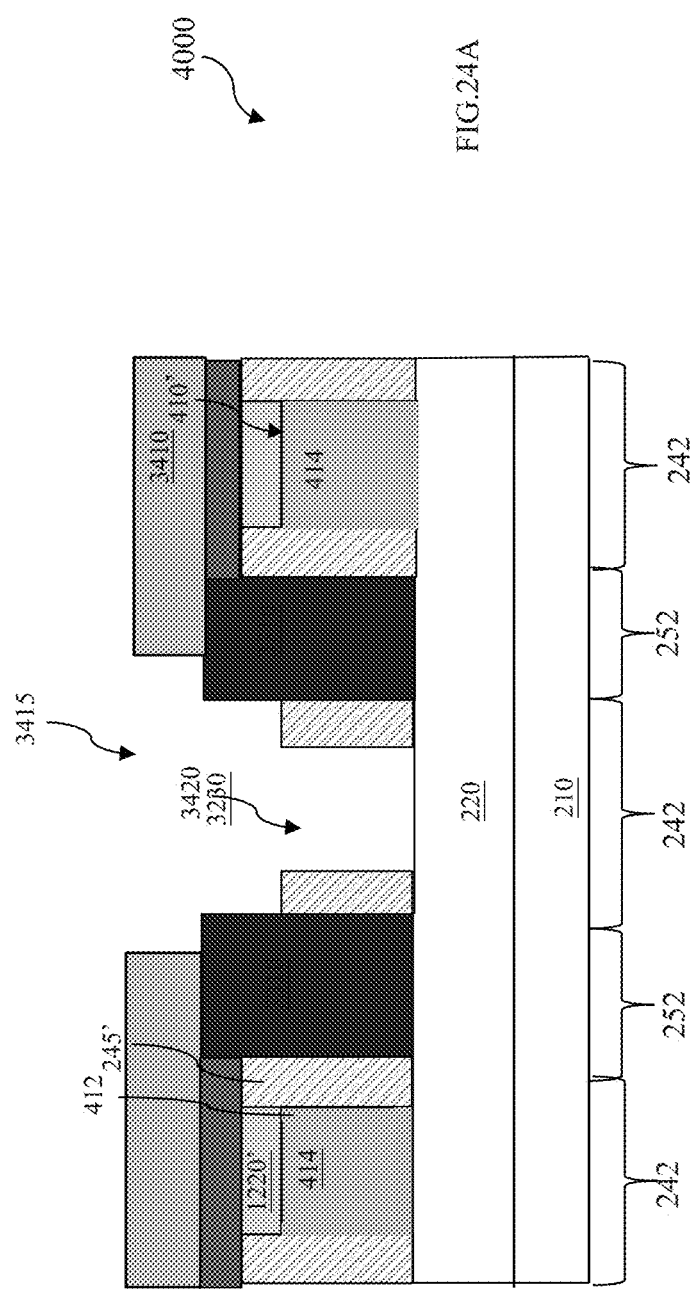
Figure 24D:
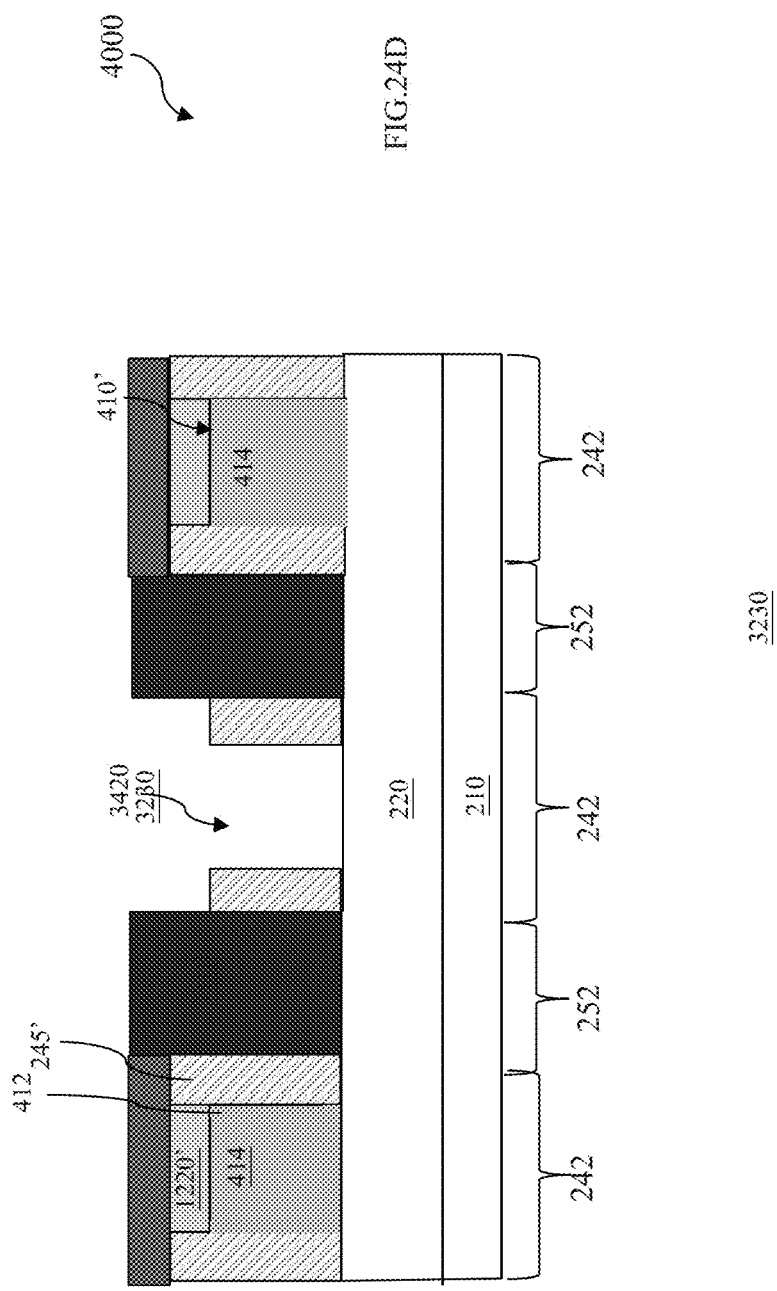

Referring to FIGS. 15, 24A, 24B and 24C, method 3000 proceeds to step 3028 removing the exposed HK/MG stack 410' through the opening 3415 to form a line-cut 3420. In the present embodiment, the line-cut 3420 extends to the isolation features 220 and divides the HK/MG line 410L into two sub-HK/MG lines, 410LA and 410LB. The sub-HK/MG lines 410LA is separated away from the sub-HK/MG line 410LB by the width d along the direction of line B-B of FIG. 2A. The etching process is similar in many respects to the etching process discussed above association with FIGS. 6A and 6B. After forming the line-cut 3420, the second patterned HM 3410 is removed by an etch process, as shown in FIGS. 24D, 24E and 24F.

Referring to FIGS. 15, 25A, 25B and 25C, method 3000 proceeds to step 3030 by filling in the line-cut 3420 with a dielectric layer 3510 to form an isolation region 3515 between two sub-HK/MG lines, 410LA and 410LB. The dielectric layer 3510 is formed similarly in many respects to the dielectric layer 710 discussed above association with FIGS. 7A and 7B, including the materials discussed therein. A CMP may be performed to polish back the dielectric layer 3510 and hereby provide a substantially planar top surface of the dielectric layer 3510 with respect to a top surface of the second HM 3230. As a result, the HK/MG line 410L is cut into the sub-HK/MG lines, 410LA and 410LB, and separated by the isolation region 3515.

Additional steps can be provided before, during, and after method 3000, and some of the steps described can be replaced, eliminated, or moved around for additional embodiments of method 3000. Other alternatives or embodiments may present without departure from the spirit and scope of the present disclosure.

The semiconductor devices, 200, 2000 and 4000, may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multi-layer interconnection structure.

Based on the above, it can be seen that the present disclosure provides methods of cutting a metal gate (MG) line after a HK/MG replaces a dummy gate stack. The method provides various process scheme of cutting MG line, such as cutting MG line after HK/MG replacing the dummy gate stack or cutting MG line after source/drain contact metal are formed. The method demonstrates a feasible and flexible process for cutting MG line.

The present disclosure provides many different embodiments of fabricating a semiconductor device that provide one or more improvements over existing approaches. In one embodiment, a method for fabricating a semiconductor device includes forming a first fin and a second fin on a substrate. The first fin has a first gate region and the second fin has a second gate region. The method also includes forming a metal-gate line over the first and second gate regions. The metal-gate line extends from the first fin to the second fin. The method also includes applying a line-cut to separate the metal-gate line into a first sub-metal gate line and a second sub-metal gate line and forming an isolation region within the line cut.

In another embodiment, a method includes forming a plurality of metal gate stacks over a substrate such that the plurality of gate stacks connect to each other to form a metal-gate line. The plurality of metal gate stacks has sidewall spacers disposed along sidewalls of the metal gate stacks. The method also includes forming source/drain features in the substrate adjacent the metal gate stacks, forming a dielectric layer over the metal gate stacks and the source/drain features, recessing the plurality of metal gate stacks and the sidewall spacers, forming a hard mask over the recessed plurality of metal gate stacks and the recessed sidewall pacers, removing a portion of the dielectric layer to expose the source/drain features while the hard mask protects the recessed metal gate stacks and the recessed sidewall spacers. The method also includes forming a contact metal layer over the exposed source/drain features, forming a line-cut to cut the metal-gate line into sub-metal-gate lines and forming an isolation region within the line cut.

In yet another embodiment, a method includes forming a plurality of fins on a substrate, each of the fins having a gate region, forming dummy gate stack in each gate region, forming sidewall spacers along sidewalls of each dummy gate stack, forming an interlayer dielectric (ILD) layer over the substrate, including beside the dummy gate stacks. The method also includes removing the dummy gate stacks to expose portions of the fins in the gate region, forming metal gate stacks over the exposed portions of the fins, wherein the metal gate stack form a metal-gate line, recessing the metal gate stacks, forming a hard mask over the recessed metal gate stacks, forming a line-cut to cut the metal-gate line into sub-metal-gate lines while the hard mask protects the metal gate stacks and forming an isolation region within the line cut.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin on a substrate, the first fin having a first gate region and the second fin having a second gate region;
    forming a metal-gate line over the first and second gate regions, wherein the metal-gate line extends from the first fin to the second fin;
    applying a line-cut to separate the metal-gate line into a first sub-metal gate line and a second sub-metal gate line; and
    forming an isolation region within the line cut.

2. The method of claim 1, wherein applying the line-cut to separate the metal-gate line into the first sub-metal gate line and the second sub-metal gate line includes:
forming a patterned hard mask over the metal-gate line, wherein the patterned hard mask defines an opening; and
etching the metal-gate line through the opening.

3. The method of claim 1, wherein forming the isolation region within the line cut includes:
forming a dielectric layer in the line cut; and
recessing the dielectric layer.

4. The method of claim 1, further comprising:
prior to forming the metal-gate line over the first and second gate regions, forming a dummy gate over the first and second gate regions; and
forming an interlayer dielectric (ILD) layer over the substrate, including over the dummy gate stack.

5. The method of claim 4, wherein forming the metal-gate line over the first and second gate regions includes:
removing the dummy gate to expose a portion of the first and second gate regions;
depositing a gate dielectric layer over the exposed portions of the first and second gate regions; and
depositing a metal layer over the gate dielectric layer in the first and second gate regions.

6. The method of claim 4, forming the metal-gate line over the first and second gate regions includes:
removing the dummy gate to expose a portion of the first and second gate regions;
depositing a gate dielectric layer over the exposed portions of the first and second gate regions;
depositing a metal layer over the gate dielectric layer in the first and second gate regions;
recessing a portion of the gate metal layer in the first and second gate regions; and
forming a hard mask over recessed gate metal layer in the first and second gate regions.

7. The method of claim 6, wherein applying the line-cut to separate the metal-gate line into the first sub-metal gate line and the second sub-metal gate line includes:
forming a patterned hard mask over the hard mask, wherein the patterned hard mask has an opening such that a portion of the gate-metal line aligned within the opening;
etching the hard mask through the opening; and
etching the metal-gate line through the opening.

8. The method of claim 7, wherein forming the metal-gate line over the first and second gate regions includes forming the metal gate line between sidewall spacers,
wherein the sidewall spacers and a portion of the dielectric layer are exposed within the opening, and
wherein etching the metal-gate line through the opening includes using the exposed sidewall spacers and the portion of the dielectric layer as an etch mask.

9. A method comprising:
forming a plurality of metal gate stacks over a substrate such that the plurality of gate stacks connect to each other to form a metal-gate line, wherein the plurality of metal gate stacks have sidewall spacers disposed along sidewalls of the metal gate stacks;
forming source/drain features in the substrate adjacent the metal gate stacks;
forming an interlayer dielectric (ILD) layer over the metal gate stacks and the source/drain features;
recessing the plurality of metal gate stacks and the sidewall spacers;
forming a hard mask over the recessed plurality of metal gate stacks and the recessed sidewall pacers;
removing a portion of the ILD layer to expose the source/drain features while the hard mask protects the recessed metal gate stacks and the recessed sidewall spacers;
forming a contact metal layer over the exposed source/drain features;
forming a line-cut to cut the metal-gate line into sub-metal-gate lines; and
forming an isolation region within the line cut.

10. The method of claim 9, wherein forming the plurality of metal gate stacks over the substrate such that the plurality of gate stacks connect to each other to form the metal-gate line includes:
forming a plurality of fins extending from a substrate, each of the fins from the plurality of fins having a source/drain region and a gate region;
forming dummy gate stacks in the each of the gate regions;
removing the dummy gate stacks to expose portions of the fins from the plurality of fins; and
forming the plurality of metal gate stacks over the exposed portions of the fins.

11. The method of claim 9, wherein recessing the plurality of metal gate stacks and the sidewall spacers includes:
recessing the plurality of metal gate stacks without substantially etching the sidewall spacers;
forming an another hard mask over the recessed plurality of metal gate stacks; and
recessing the sidewall spacers without substantially etching the another hard mask, wherein a top surface of the recessed sidewall spacers is substantially coplanar with a top surface of the hard mask.

12. The method of claim 11, wherein forming the hard mask over the recessed plurality of metal gates and the recessed sidewall spacers includes forming the hard mask over the another hard mask and the recessed sidewall spacers.

13. The method of claim 9, wherein forming the line-cut to cut the metal-gate line into sub-metal-gate lines includes:
forming a patterned hard mask over the metal-gate line, wherein the patterned hard mask has an opening; and
etching the metal-gate line through the opening.

14. The method of claim 13, wherein the recessed sidewall spacers and a portion of the contact metal layer are exposed within the opening, and
wherein etching the metal-gate line through the opening includes using the sidewall spacers and the portion of the contact metal layers as an etch mask.

15. The method of claim 9, wherein forming the isolation region within the line cut includes;
filling in the line cut with a dielectric layer; and
recessing the dielectric layer.

16. A method comprising:
forming a plurality of fins on a substrate, each of the fins having a gate region;
forming dummy gate stack in each gate region;
forming sidewall spacers along sidewalls of each dummy gate stack;
forming an interlayer dielectric (ILD) layer over the substrate, including beside the dummy gate stacks;
removing the dummy gate stacks to expose portions of the fins in the gate region;
forming metal gate stacks over the exposed portions of the fins, wherein the metal gate stack form a metal-gate line;

recessing the metal gate stacks;

forming a hard mask over the recessed metal gate stacks;

forming a line-cut to cut the metal-gate line into sub-metal-gate lines while the hard mask protects the metal gate stacks; and forming an isolation region within the line cut.

17. The method of claim 16, wherein recessing the metal gate stacks includes recessing the metal gate stacks without substantially etching the sidewall spacers and the ILD layer.

18. The method of claim 17, wherein forming the hard mask over the recessed metal gate stacks includes forming the hard mask over the another hard mask.

19. The method of claim 16, wherein forming the line-cut to cut the metal-gate line into sub-metal-gate lines includes:

forming a patterned hard mask over the metal-gate line, wherein the patterned hard mask has an opening;

etching the hard mask through the opening; and etching the metal-gate line through the opening.

20. The method of claim 19, wherein forming the isolation region within the line cut includes;

filling in the line cut with a dielectric layer; and recessing the dielectric layer.

\* \* \* \* \*